United States Patent
Komatsuzaki

(10) Patent No.: US 6,760,247 B2
(45) Date of Patent: Jul. 6, 2004

(54) METHODS AND APPARATUS FOR FLEXIBLE MEMORY ACCESS

(75) Inventor: Katsuo Komatsuzaki, Ibaraki (JP)

(73) Assignee: Texas Instruments Incorporated, Dallas ( * ) Notice: Subject to any disclaimer, the term of this patent is extended or adjusted under 35 U.S.C. 154(b) by 0 days.

(21) Appl. No.: 10/256,838

(22) Filed: Sep. 27, 2002

(65) Prior Publication Data
US 2004/0062107 A1 Apr. 1, 2004

(51) Int. Cl.[7] .............................. G11C 11/22; G11C 8/00

(52) U.S. Cl. .................... 365/145; 365/230.06; 365/196

(58) Field of Search ............................ 365/145, 230.06, 365/196, 149, 189.09, 65, 189.01

(56) References Cited

U.S. PATENT DOCUMENTS 5,748,554 A * 5/1998 Barth et al. ............. 365/230.03
5,892,728 A * 4/1999 Allen et al. ............. 365/230.06

OTHER PUBLICATIONS

"A Survey of Circuit Innovations in Ferroelectric Random–Access Memories", Ali Sheikholeslami and P. Glenn Gulak, Proceedings of the IEEE, vol. 88, No. 5, May, 2000, pp. 667–689.

* cited by examiner

Primary Examiner—Thong Q. Le
(74) Attorney, Agent, or Firm—Jacqueline J. Garner; W. James Brady, III; Frederick J. Telecky, Jr.

(57) ABSTRACT

Memory devices and methods are presented for selectively reading or writing rows or columns of memory cells in a ferroelectric memory array, wherein sense amps are selectively coupled with row lines or column lines and decoder outputs are coupled with column lines or row lines for row or column memory access operations, respectively.

21 Claims, 21 Drawing Sheets

METHODS AND APPARATUS FOR FLEXIBLE MEMORY ACCESS

FIELD OF INVENTION

The present invention relates generally to semiconductor devices and more particularly to apparatus and methods for writing and/or reading row or column data to or from a memory array.

BACKGROUND OF THE INVENTION

In semiconductor memory devices, data is read from or written to memory cells in the device according to decoded address information and various other control signals. Such memory devices are used for storage of data and or program code in personal computer systems, embedded processor-based systems, video image processing circuits, and the like. Ferroelectric memories are commonly organized in single-transistor, single-capacitor (1T1C) or two-transistor, two-capacitor (1T1C) configurations, in which each memory cell includes one or more access transistors, as is generally known. The ferroelectric memory cells typically comprise one or more ferroelectric (FE) capacitors adapted to store a binary data bit, wherein the access transistor or transistors, typically MOS devices, are operable to selectively connect the FE capacitor to one of a pair of complimentary bitlines, with the other bitline being connected to a reference voltage. The individual cells are commonly organized as individual bits of a corresponding data word, where the cells of a given word are accessed concurrently by activation of platelines and wordlines by address decoding circuitry.

Such ferroelectric memory devices provide non-volatile data storage where data memory cells are constructed using ferroelectric dielectric material which may be polarized in one direction or another in order to store a binary value. The ferroelectric effect allows for the retention of a stable polarization in the absence of an applied electric field due to the alignment of internal dipoles within Perovskite crystals in the dielectric material. This alignment may be selectively achieved by application of an,electric field which exceeds the coercive field of the material. Conversely, reversal of the applied field reverses the internal dipoles. The response of the polarization of a ferroelectric capacitor to the applied voltage may be plotted as a hysteresis curve.

Data in a ferroelectric data cell is read by connecting a reference voltage to a first bitline and connecting the cell capacitor between a complimentary bitline and a plateline signal voltage. This provides a differential voltage on the bitline pair, which is connected to a sense amp circuit. The reference voltage is typically supplied at an intermediate voltage between the voltage associated with a capacitor charged to a binary "0" and that of the capacitor charged to a binary "1". The polarity of the sensed differential voltage thus represents the data stored in the cell, which is buffered and applied to a pair of local IO lines. The transfer of data between the ferroelectric memory cell, the sense amp circuit, and the local data bitlines is controlled by various access transistors, typically MOS devices, with switching signals being provided by control circuitry in the device.

Connection of the ferroelectric cell capacitor between the plateline and the bitline during a read operation causes an electric field to be applied to the cell capacitor. If the field is applied in a direction to switch or reverse the internal dipoles, more charge will be moved than if the dipoles are not reversed. As a result, the sense amplifier can measure the charge applied to the cell bit lines and produce either a logic "1" or "0" at the sense amp terminals. Since reading the cell data is a destructive operation, the sensed data is then restored to the cell following each read operation. To write data to the cell, an electric field is applied to the cell capacitor by a sense amp or write buffer to polarize it to the desired state. Ferroelectric memories provide certain performance advantages over other forms of non-volatile data storage devices, such as flash and EEPROM type memories. For example, ferroelectric memories offer short programming (e.g., write access) times and low power consumption.

Ferroelectric memory devices typically include a number of individually addressable memory cells arranged in an array configuration, wherein the array is typically organized as a matrix of rows and columns. Conventionally, data is stored into a memory array as a row, and read out from the memory array as a row, where the row typically consists of 8, 16, 32, or 64 bits of binary data. In such a conventional ferroelectric memory device, row decoder circuitry is connected to a first side of a ferroelectric memory cell of interest and the second side is connected to IO circuitry using a sense amp. During a write operation, the row decoder provides plateline pulse signals to the first side of each ferroelectric cell in a data row and the other sides are connected to the write data. In a read operation, the decoder provides plate line pulses to the first side of each ferroelectric memory cell in a data row, and sense amplifiers are connected to the other side of the cells to read a row of stored data bits in parallel fashion. In a single read operation, an entire row of data bits (e.g., 8, 16, 32, or 64 bits) are obtained from the memory cells in the selected row.

However, there are situations in which only the data in one or a few columns of the array is needed. For example, in image processing applications it may be desirable to read the first data bit from a number of different rows, such as the first bit from 16 data rows. In conventional memory architectures, a single parallel read of a column of data is not possible. Instead, this would require 16 read operations, one for each of the 16 rows. Thus, the effective read out speed for column data is much slower than for row data in existing memory devices. A parallel situation exists for write operations, wherein conventional memory architectures require 16 write operations just to write a column of 16 cells. Accordingly, there is a need for improved memory devices and methodologies, by which parallel column and row data accesses can be done at comparable speeds for read and/or write operations.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in simplified form as a prelude to the more detailed description that is presented later. The invention relates to memory devices and methods in which rows or columns of data can be accessed for reading and/or writing in a single memory operation, by which the above mentioned and other disadvantages associated with conventional memory devices may be mitigated or overcome.

One aspect of the invention relates to memory devices comprising an array with memory cells arranged in columns and rows, where individual memory cells are coupled with a single row line and a single column line. Row sense amps are provided, individually comprising a row sense amp input coupled with one of the row lines, where the row sense amps are operable to sense a memory cell data state during a column read operation and to provide write data during a column write operation. Column sense amps are also provided, which individually comprise a column sense amp input coupled with one of the column lines, and which are adapted to sense a memory cell data state during a row read operation and to provide write data during a row write operation. A decoder is also provided, which comprises a plurality of row decoder outputs coupled with the row lines and column decoder outputs coupled with the column lines. The decoder operates to provide a plateline signal to one of the row decoder outputs according to address information for a selected row during a row read or write operation, and to provide a plateline signal to one of the column decoder outputs according to address information for a selected column during a column read or write operation.

In accordance with another aspect of the invention, a ferroelectric memory device is provided, comprising an array with memory cells arranged in columns and rows, where individual memory cells are coupled with a single row line and a single column line. The device comprises a plurality of sense amps to sense or write a memory cell data state when a memory cell is coupled with an input thereof, and a decoder is provided comprising a plurality of decoder outputs. The decoder provides a plateline signal to one of the decoder outputs according to address information for a selected row or column during a read or write operation. The memory device further comprises a selector system coupled with the row lines, the column lines, the sense amps, and the decoder outputs. The selector system operates to selectively couple at least one of the row lines with one of the decoder outputs and to couple the column lines with the sense amp inputs to read or write a row of memory cells. In addition, the selector system couples at least one of the column lines with one of the decoder outputs and couples the row lines with the sense amp inputs to read or write a column of memory cells.

According to yet another aspect of the invention, a ferroelectric memory device is provided, comprising a memory array of ferroelectric memory cells arranged in columns and rows, with a plurality of column lines and row lines, where the cells are individually coupled with a single row line and a single column line in the array. The ferroelectric memory device further comprises means for selectively accessing a group of memory cells along one of a column line and a row line in a single memory operation. In one implementation, the means for selectively accessing a group of memory cells comprises a plurality of row sense amps, a plurality of column sense amps, and a decoder having a plurality of row decoder outputs coupled with the row lines and a plurality of column decoder outputs coupled with the column lines.

In another exemplary implementation, the means for selectively accessing a group of memory cells comprises a plurality of sense amps for sensing or writing cell data and a decoder with decoder outputs for selectively providing a plateline signal to one row or column of memory cells. The means for selectively accessing a group of memory cells in this example also comprises a selector system coupled with the row lines, the column lines, the sense amps, and the decoder outputs. The selector system couples one or more of the row lines with one of the decoder outputs and couples the column lines with the sense amp inputs to read or write a row of memory cells. In addition, the selector system couples one or more of the column lines with one of the decoder outputs and couples the row lines with the sense amp inputs to read or write a column of memory cells.

In accordance with still another aspect of the invention, methods are provided for reading a row or a column of ferroelectric memory cells in a memory array, comprising coupling column lines to sense amps, providing a plateline signal to one or more row lines, and sensing memory cell data states associated with a row of memory cells during a row read operation. The method further comprises coupling the row lines to the sense amps, providing a plateline signal to one of the column lines, and sensing memory cell data states associated with a column of memory cells during a column read operation.

According to yet another aspect of the invention, methods are provided for writing a row or a column of ferroelectric memory cells in a memory array. The method comprises coupling the column lines to sense amps, providing a plateline signal to one or more of the row lines, and writing memory cell data states to a row of memory cells using the sense amps during a row write operation. In addition, the method comprises coupling the plurality of row lines to the sense amps, providing a plateline signal to one of the column lines, and writing memory cell data states to a column of memory cells during a column write operation.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
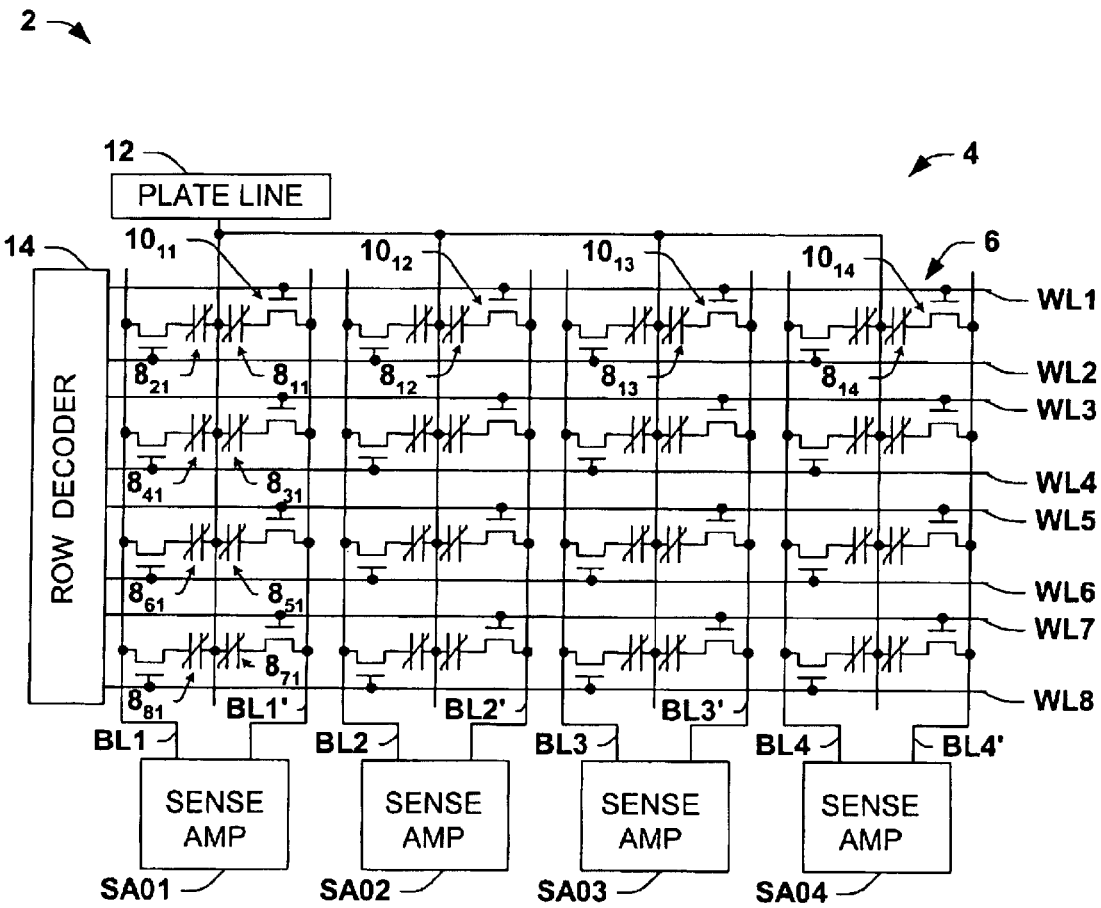
FIG. 1 is a schematic diagram illustrating a conventional ferroelectric memory device in which rows of data may be read or written in a single memory access operation, but where column-wise read or write access is not possible in a single operation.

The present invention will now be described with reference to the attached drawings, wherein like reference numerals are used to refer to like elements throughout. The invention relates to methods and memory devices in which column or row-wise access is provided to read and/or write ferroelectric memory cells in a single memory access operation. While described herein in the context of one or more exemplary memory architectures or configurations, it will be appreciated that the present invention is not limited to the specific architectures and apparatus illustrated herein, and that other architectures are contemplated as falling within the scope of the present invention and the appended claims.

Referring initially to FIG. 1, a conventional ferroelectric memory device 2 is illustrated, in which rows of data along wordlines WL1–WL8 may be read and written in a single memory access operation, but where column-wise access along bitlines BL1/BL1'–BL4/BL4' is not possible in a single operation. The device 2 includes an array 4 of ferroelectric memory cells 6 arranged in rows along the wordlines WL1–WL8 and columns along the bitlines BL1/BL1'–BL4/BL4' in a folded bitline configuration, with each cell 6 having a ferroelectric capacitor 8 and an access transistor 10 in series with the cell capacitor 8 (e.g., 1T1C). A plateline signal 12 is selectively provided to one terminal of the cell capacitors being accessed, wherein the other side of the capacitors 8 are connected to one of the bitlines BL1/BL1'–BL4/BL4' through the associated access transistor 10. The access transistors 10 are gated by the wordline signals WL1–WL8 provided by a row decoder circuit 14. Differential sense amps SA01–SA04 are located at the bottoms of the columns with inputs connected to the complimentary bitline pairs BL1/BL1'–BL4/BL4'.

In accessing the cells 6 in the array 4, reading and writing is performed in a row-wise fashion, wherein the decoder 14 selects a desired row based on address information (not shown), and accordingly asserts one of the wordlines WL1–WL8. In a write operation, the sense amps SA01–SA04 provide a differential voltage across the complimentary bitline pairs BL1/BL1'–BL4/BL4', wherein the polarities of the differential voltages are representative of write data to be stored in the row of cells 6 being accessed. A plateline signal 12, such as a low-high-low pulse is applied to the array, so as to create a voltage potential across the ferroelectric capacitors 8 of the cells 6 being accessed. The resulting electric field in the ferroelectric material of the accessed cell capacitors 8 provides polarization of dipoles therein, by which a known, non-volatile memory cell data state is established in each of the cells 6.

In a read operation, the decoder 14 again selects the row of interest by asserting one of the wordlines WL1–WL8, and the plateline signal 12 is again applied to the array 4. This connects the accessed cell capacitors 8 between the plateline voltage 12 and one of the complimentary bitlines, with the other bitline being held at a reference voltage (e.g., VDD/2). The sense amps SA01–SA04 sense differential voltages across the complimentary bitline pairs BL1/BL1'–BL4/BL4', which correspond to the memory cell data states prior to the read operation. The data states may then be transferred to IO buffer circuitry (not shown), and are then refreshed back into the memory cells 6.

As can be seen from the memory device 2 in FIG. 1, access for both read and write operations is performed on a row-wise basis, where a single row of cells 6 is read from or written to in a single memory access operation. Thus, for example, the device 2 provides single operation access for reading or writing data from or to the cell capacitors $8_{11}$, $8_{12}$, $8_{13}$, and $8_{14}$ along the wordline WL1. However, in certain memory applications, such as video image processing, it may be desirable to read or write data in column-wise fashion. For example, it may be desired to read out the data from the first column of cell capacitors $8_{11}$, $8_{21}$, $8_{31}$, $8_{41}$, $8_{51}$, $8_{61}$, $8_{71}$, $8_{81}$. In the device 2, eight individual read operations are required, the first asserting WL1, another asserting WL2, another asserting WL3, and so on, with an eighth read operation asserting WL8.

Figure 2:
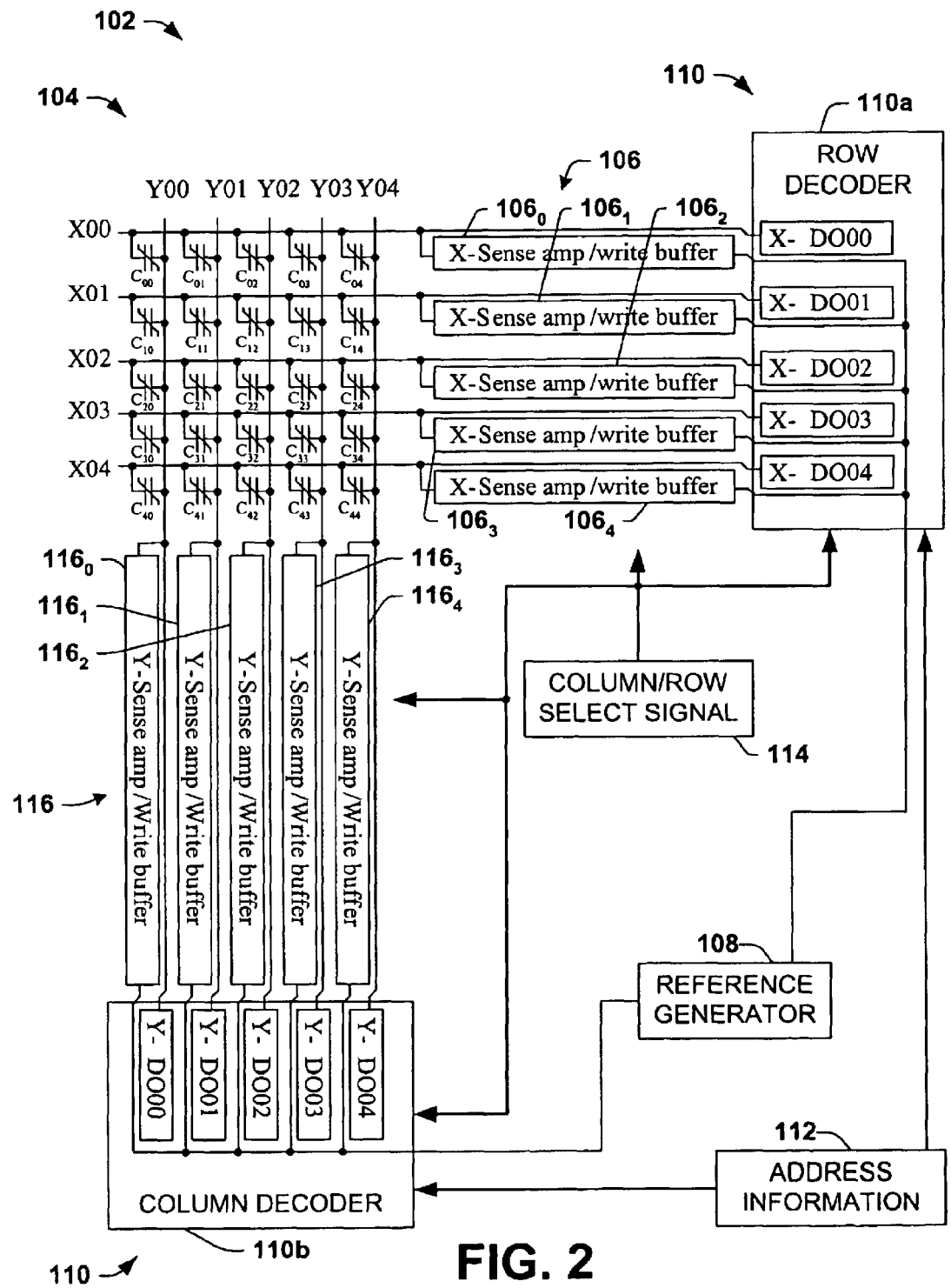
FIG. 2 is a schematic diagram illustrating an exemplary memory device providing row or column access for reading or writing data in a memory array in accordance with an aspect of the present invention.
Figure 3:
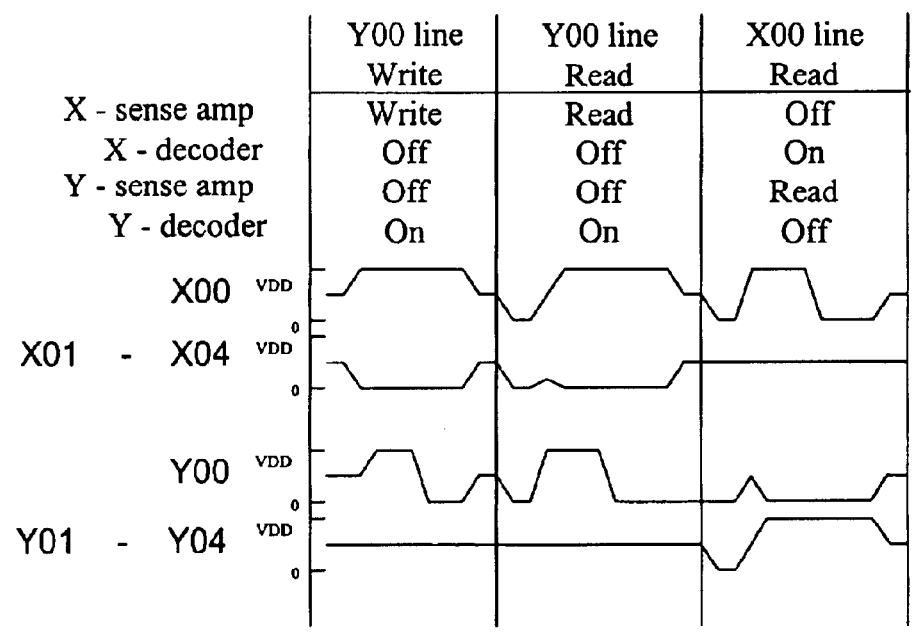
FIG. 3 is a timing diagram further illustrating operation of the memory device of FIG. 2.

Referring now to FIGS. 2 and 3, the invention advantageously provides memory devices and methods by which data cells in a ferroelectric memory array can be accessed in either row-wise or column-wise fashion in a single memory operation (e.g., read or write). FIG. 2 illustrates an exemplary ferroelectric memory device 102 in accordance with one aspect of the invention. The memory device 102 comprises a memory array 104 comprising a plurality of ferroelectric memory capacitors or cells $C_{rc}$ (e.g., wherein "r" is the row number and "c" is the column number of a given cell) arranged in columns and rows (e.g., 5 columns and 5 rows in this example). The array 104 further comprises a plurality of column lines Y00, Y01, Y02, Y03, and Y04 individually associated with one of the five columns of cells $C_{rc}$, and a plurality of row lines X00, X01, X02, X03, and X04 individually associated with one of the five rows in the array 104. The individual memory cells comprise a ferroelectric capacitor $C_{rc}$ having terminals coupled with a single row line X and a single column line Y in the array 104.

The memory device 102 further comprises a plurality of row sense amps $106_0$, $106_1$, $106_2$, $106_3$, and $106_4$, individually comprising a row sense amp input coupled with one of the plurality of row lines X00, X01, X02, X03, and X04, respectively. The row sense amps 106 operate individually to sense a memory cell data state during a column read operation, and/or to provide write data to the corresponding row line during a column write operation. The sense amps

106, moreover, may be differential with two input terminals, wherein a reference voltage (e.g., VDD/2) is provided from a reference generator 108 to a second sense amp input terminal during read operations. A plurality of column sense amps 116$_0$, 16$_1$, 116$_2$, 116$_3$, and 116$_4$ are also provided, individually comprising a column sense amp input coupled with one of the plurality of column lines Y00, Y01, Y02, Y03, and Y04, respectively, wherein the column sense amps are individually adapted to sense a memory cell data state during a row read operation, and/or to provide write data to the corresponding column line during a row write operation.

A decoder 110 is provided, comprising a row decoder 110a and a column decoder 110b, which provide a plurality of row decoder outputs X-DO00, X-DO01, X-DO02, X-DO03, and X-DO04 individually coupled with the row lines X00, X01, X02, X03, and X04, respectively, and a plurality of column decoder outputs Y-DO00, Y-DO01, Y-DO02, Y-DO03, and Y-DO04 individually coupled with the column lines Y00, Y01, Y02, Y03, and Y04, respectively. The decoder 110 is adapted to provide a plateline signal to a selected one of the row decoder outputs (e.g., X-DO00, X-DO01, X-DO02, X-DO03, or X-DO04) according to address information 112 for a selected row during a row read or write operation, and to provide a plateline signal to one of the column decoder outputs e.g., Y-DO00, Y-DO01, Y-DO02, Y-DO03, or Y-DO04) according to the address information 112 for a selected column during a column read or write operation.

In operation, a column of data, for example, the first column along the column line Y00 may be accessed in a column read operation by activating the column decoder output Y-DO00 according to the address information 112 and a column/row select signal 114, and by also activating the row sense amp/write buffers 106. In a column read, the reference generator 108 provides a reference voltage (e.g., VDD/2) to one complimentary sense amp input terminal of each row sense amp 106, while the cell voltages are provided to the other sense amp inputs along the respective row lines X00, X01, X02, X03, and X04, whereby the individual sense amps 106 sense and latch a voltage whose polarity corresponds to the cell data.

It is noted at this point that the device 102 advantageously allows reading of all the data cells along the column line Y00 in a single memory access operation. In similar fashion, data may be written from the row sense amp/write buffers 106 to a selected column of cells in a single memory access operation, such as the cells along the column line Y00, where the plateline signal is again applied to the column line Y00 by actuation of the column decoder output Y-DO00.

Row-wise access is also provided via single row read or write operations in the device 102. For example, a row of data along the first row line X00 may be accessed in a row read operation by activating the row decoder output X-DO00 according to the address information 112 and the column/row select signal 114, and also activating the column sense amp/write buffers 116. The reference generator 108 provides the reference voltage to one complimentary sense amp input terminal of each column sense amp 116, while the cell voltages are provided to the other column sense amp inputs along the respective column lines Y00, Y01, Y02, Y03, and Y04, whereby the individual sense amps 116 sense and latch a voltage having a polarity representative of the cell data in the selected row.

Similarly, data may be written from the column sense amp/write buffers 116 to a selected row of cells in a single memory access operation, for example, the cells along the row line X00, where the plateline signal is applied to the row line X00 by actuation of the row decoder output X-DO00. Other rows and/or columns may be accessed for read and/or write operations in similar fashion, wherein a timing diagram 120 in FIG. 3 illustrates exemplary waveforms for the device 102 during column read and write operations along column line Y00, and for a row read operation along the row line X00. It is noted in FIG. 3 that since the cell terminal connection is opposite between row access and column access, the output state is also opposite, for example, during a read operation along the X direction. Accordingly, data inversion circuitry (not shown) may be provided between the X direction sense amp/write buffers 106 and the device IO lines, wherein any appropriate inversion circuitry may be employed for this purpose.

Figure 4A:
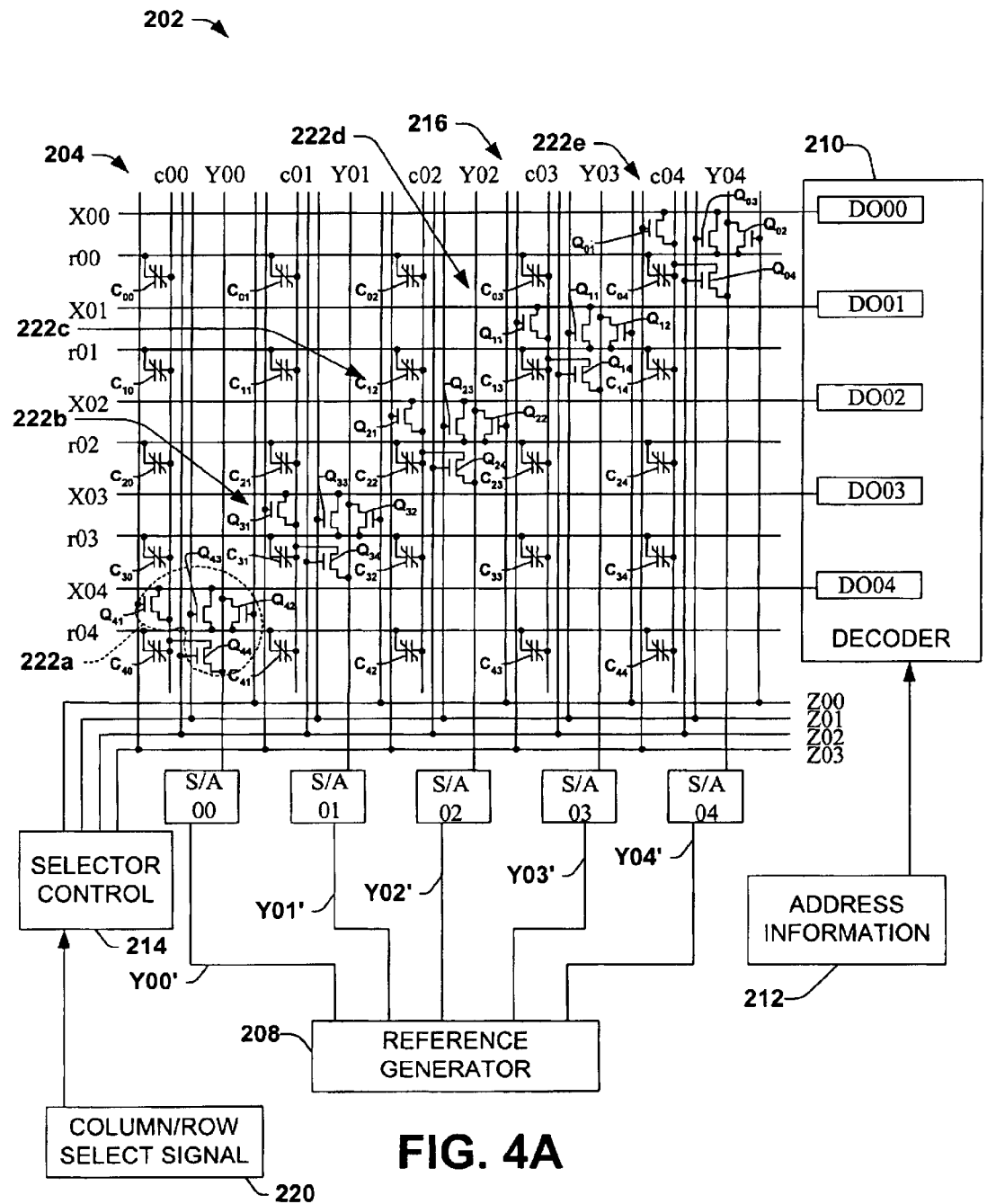
FIG. 4A is a schematic diagram illustrating another exemplary memory device providing row or column access for reading or writing data in accordance with the invention.
Figure 4B:
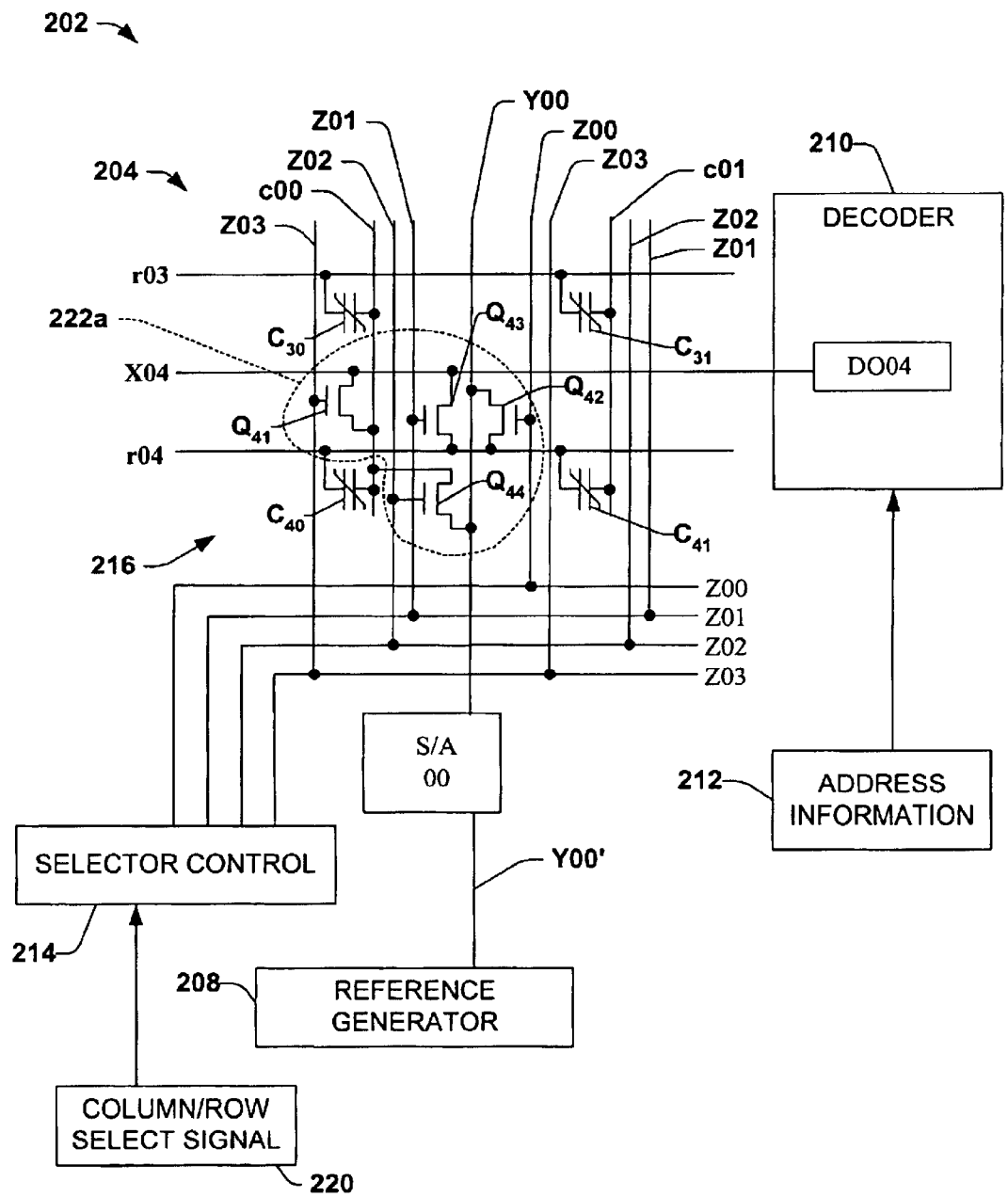
FIG. 4B is a schematic diagram illustrating an exemplary switching circuit in the memory device of FIG. 4A.
Figure 5:
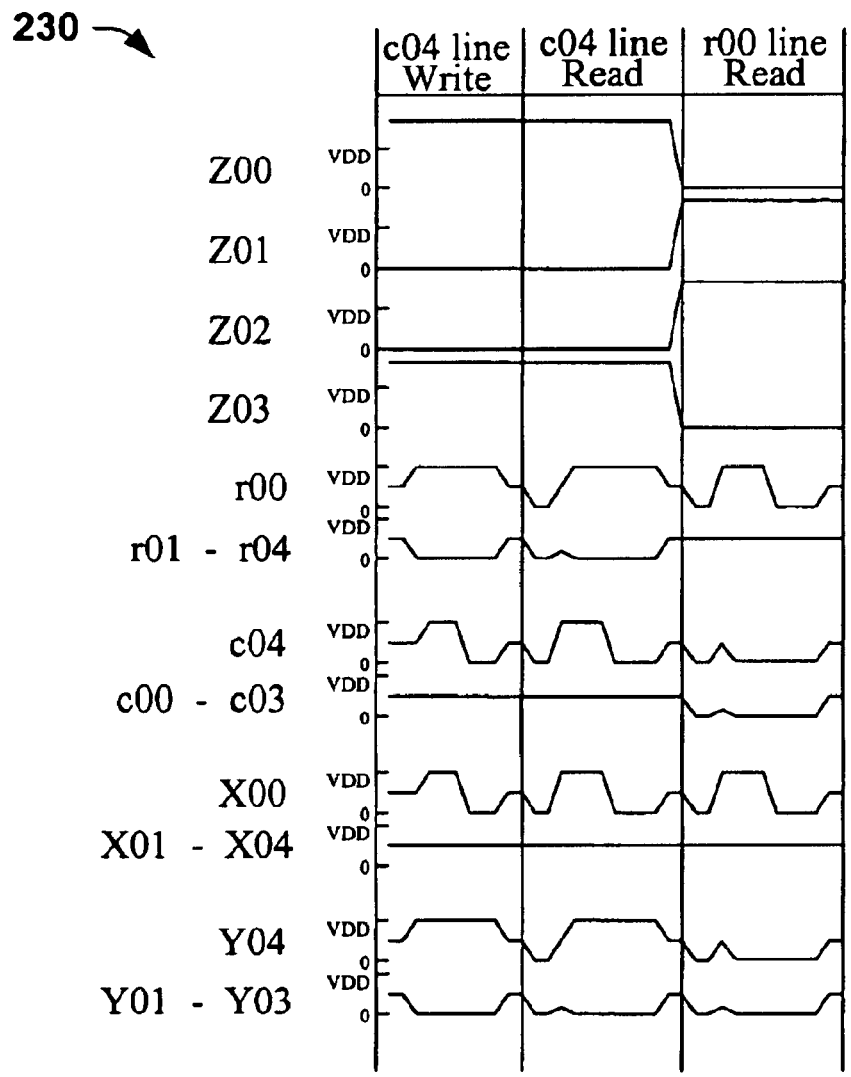
FIG. 5 is a timing diagram further illustrating operation of the memory device of FIGS. 4A and 48.

Referring now to FIGS. 4A, 4B, and 5, another aspect of the invention provides a ferroelectric memory device 202 comprising a memory array 204, wherein a plurality of ferroelectric memory cells or capacitors $C_{rc}$ (e.g., wherein "r" is the row number and "c" is the column number of a given cell) are arranged in columns and rows (e.g., 5 columns and 5 rows in this example). The array 204 further comprises a plurality of column lines c00, c01, c02, c03, and c04 individually associated with one of the five columns of cells $C_{rc}$, and a plurality of row lines r00, r01, r02, r03, and r04 individually associated with one of the five rows in the array 204.

The individual memory cells comprise a single ferroelectric capacitor $C_{rc}$ having terminals coupled with a single row line "r" and a single column line "c" in the array 204. Five differential sense amps S/A00, S/A01, S/A02, S/A03, and S/A04 are provided, which comprise first sense amp input terminals adapted to sense or write a memory cell data state when a memory cell is coupled therewith via vertical routing lines Y00, Y01, Y02, Y03, and Y04, respectively. The sense amps, moreover, individually comprise a second input terminal coupled to a reference generator 208 to receive a reference voltage (e.g., VDD/2) during read operations.

Whereas the exemplary memory device 102 of FIG. 2 employs separate decoders and sense amp sets associated with rows and columns of the memory array 104, the device 202 employs a single set of five sense amps S/A00, S/A01, S/A02, S/A03, and S/A04. Furthermore, the device 202 comprises a decoder 210 having a single set of five decoder outputs DO00, DO01, DO02, DO03, and DO04 connected to horizontal routing lines X00, X01, X02, X03, and X04, respectively. In this implementation, the sense amps S/A00, S/A01, S/A02, S/A03, and S/A04 and the decoder 210 are used in both column and row-wise memory access operations to read or write cells in the array 204. The decoder 210 operates to provide a plateline signal to one of the decoder outputs DO00, DO01, DO02, DO03, or DO04 according to address information 212 for a selected row or column during a read or write operation.

In addition, the exemplary memory device 202 comprises a selector system 216 coupled with the row lines r00–r04, the column lines c00–c04, the sense amps S/A00, S/A01, S/A02, S/A03, and S/A04, and the decoder outputs DO00, DO01, DO02, DO03, and DO04. The selector system 216 is adapted to selectively couple at least one of the row lines r00–r04 with one of the decoder outputs DO00, DO01, DO02, DO03, or DO04 and to couple the column lines c00–c04 with the sense amp inputs along the vertical routing lines Y00–Y04 to read or write a row of memory cells. The selector system 216 further provides column-wise access by coupling at least one of the column lines c00–c04 with one of the decoder outputs DO00, DO01, DO02, DO03, or DO04 and the row lines r00–r04 with the sense amp inputs to read or write a column of memory cells in the array 204. Thus, the selector system 216 facilitates access to the array cells by row or column, using the single group of sense amps in a single memory operation.

The exemplary selector system 216 comprises five switching circuits 222a–222e, one of which, 222a, is further illustrated in FIG. 4B. The individual switching circuits 222a–222e are coupled with one of the row lines r00–r04, one of the column lines c00–c04, one of the sense amp inputs along the vertical routing lines Y00–Y04, and one of the decoder outputs along horizontal routing lines X00–X04. For example, in FIG. 4B, the illustrated switching circuit 222a is coupled with the row line r04, the column line c00, the input to the sense amp S/A00 along the vertical routing line Y00, and the decoder output DO04 along the horizontal line X04. The switching circuit 222a is adapted to selectively couple the row line r04 with the decoder output DO04 along line X04 and to couple the column line c00 with the sense amp input along line Y00 during a row read or a row write operation. During a column operation (e.g., read or write), the switching circuit 222a couples the column line coo with the decoder output DO04 along the routing line X04 and couples the row line r04 with the sense amp input along line Y00.

The same is true of the other individual switching circuits, by which the selector system 216 provides selective access for row-wise or column-wise memory operations in the array 204 according to selector control signals Z00, Z01, Z02, and Z03 from a selector control circuit 214, as illustrated further in a timing diagram 230 in FIG. 5. The selector control circuit 214 operates to provide the signals Z00, Z01, Z02, and Z03 according to a column/row select signal 220, and the address information 212 is used by the decoder 210 to provide a decoder output to the selected row or column of interest in the array 204. The control signals Z00, Z01, Z02, and Z03 thus operate the individual switching circuits 222 to employ the sense amps S/A00, S/A01, S/A02, S/A03, and S/A04 to read or write a column of five cells (e.g., such as cells. $C_{00}$, $C_{10}$, $C_{20}$, $C_{30}$, and $C_{40}$, along column line c00) or a row of five cells (e.g., such as cells $C_{00}$, $C_{01}$, $C_{02}$, $C_{03}$, and $C_{04}$, along row line r00).

Although illustrated in the context of the exemplary array 204 having five rows and five columns, it will be appreciated that the various aspects of the present invention find utility in association with memory arrays of any size. In addition, any type or form of sense amps may be employed in accordance with the invention, including latch type differential sense amplifier circuits as are known, and others. Furthermore, any appropriate circuitry may be employed in providing a decoder or decoders in accordance with the invention, in order to provide a plate line signal selectively to a row or column of interest in a memory access operation. Moreover, any appropriate reference generator circuitry may be employed in constructing a memory device in accordance with the present invention, such as a dummy cell scheme, or other circuits as are known.

As illustrated in FIG. 4B, the exemplary switching circuits 222a individually comprise four MOS transistor switches, although any appropriate switching device or devices may be employed in accordance with the invention. The circuit 222a, for example, comprises a first transistor switching device $Q_{41}$ adapted to electrically connect the column line c00 to the decoder output DO04 along line X04, and a second switching device $Q_{42}$ adapted to electrically connect the row line r04 to the input to the sense amp S/A00 along the line Y00 during a column read or write operation. In addition, the circuit 222a comprises a third switching device $Q_{43}$ adapted to electrically connect the row line r04 to the decoder output DO04 during a row read or write operation, and a fourth switching device $Q_{44}$ to electrically connect the column line c00 to the sense amp input along line Y00 during a row read or write operation. It is noted in FIG. 5 that since the cell terminal connection is opposite between row access and column access, the output state is also opposite, for example, during read operations. Accordingly, data inversion circuitry (not shown) may be provided between the sense amp/write buffers and the device IO lines to selectively invert read data during column or row read operations, wherein any appropriate inversion circuitry may be employed for this purpose.

Figure 6A:
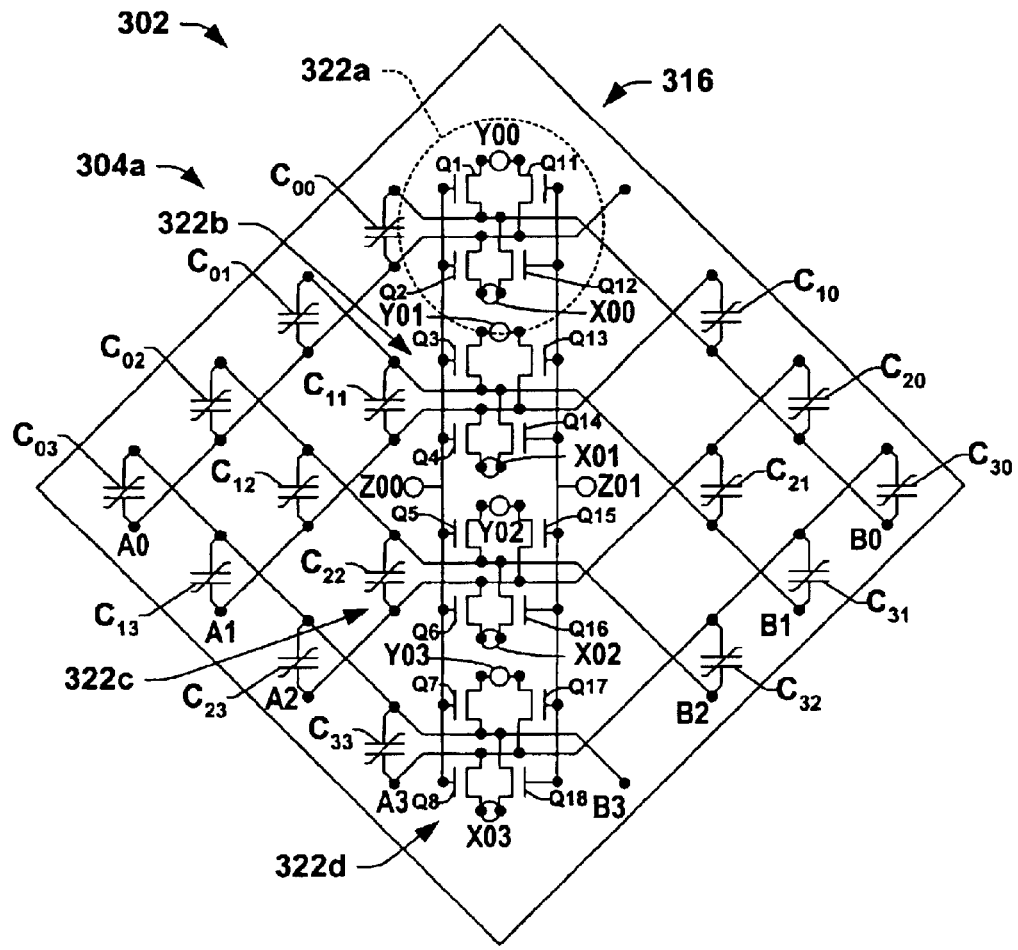
FIGS. 6A and 6B are schematic diagrams illustrating a portion of another exemplary memory device in accordance with the invention.
Figure 6B:
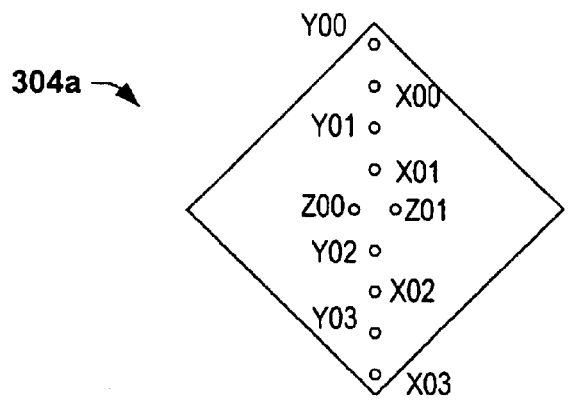
Figure 7:
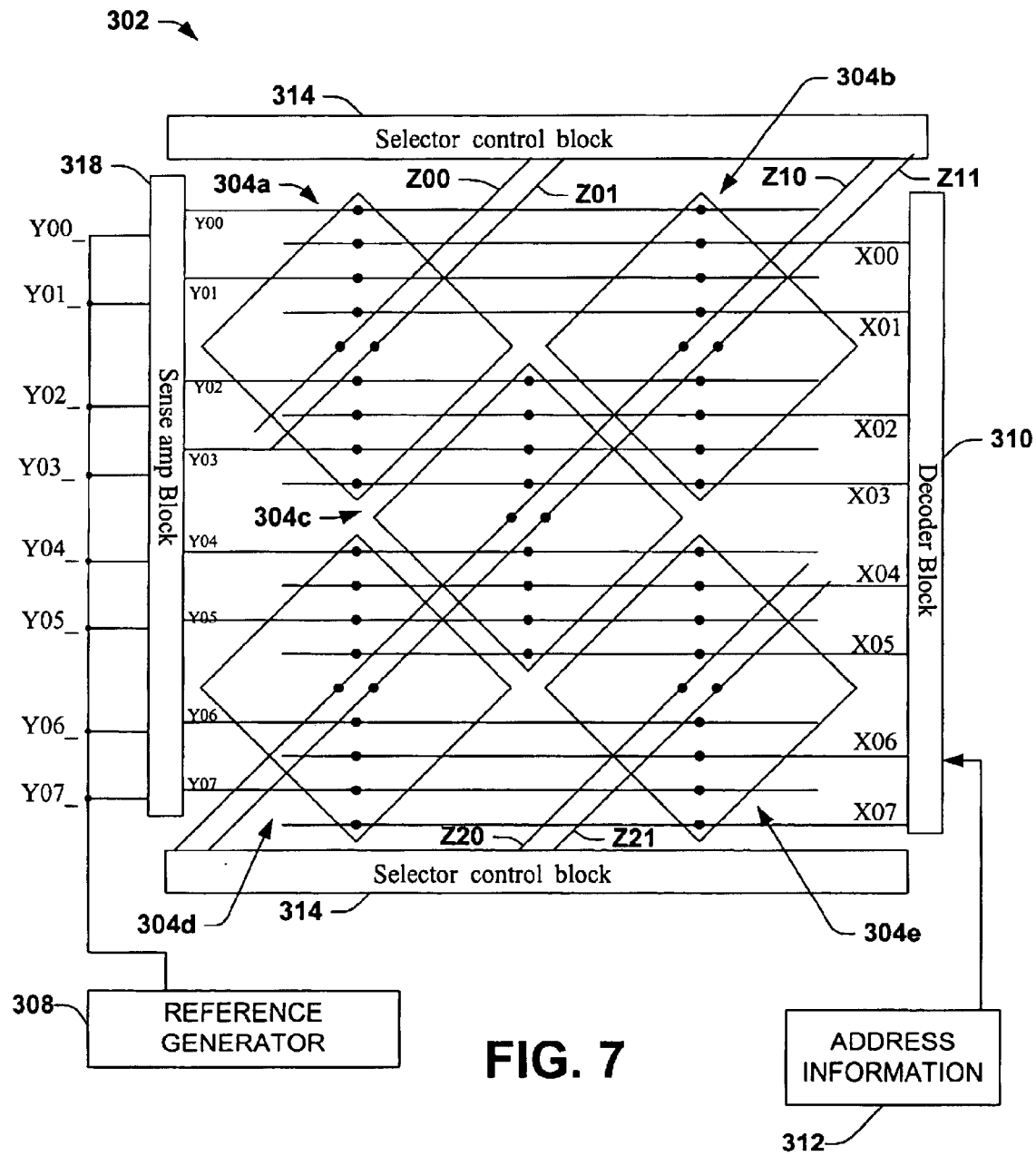
FIG. 7 is a schematic diagram illustrating an exemplary open bitline memory device using the memory portion of FIGS. 6A and 6B.
Figure 8:
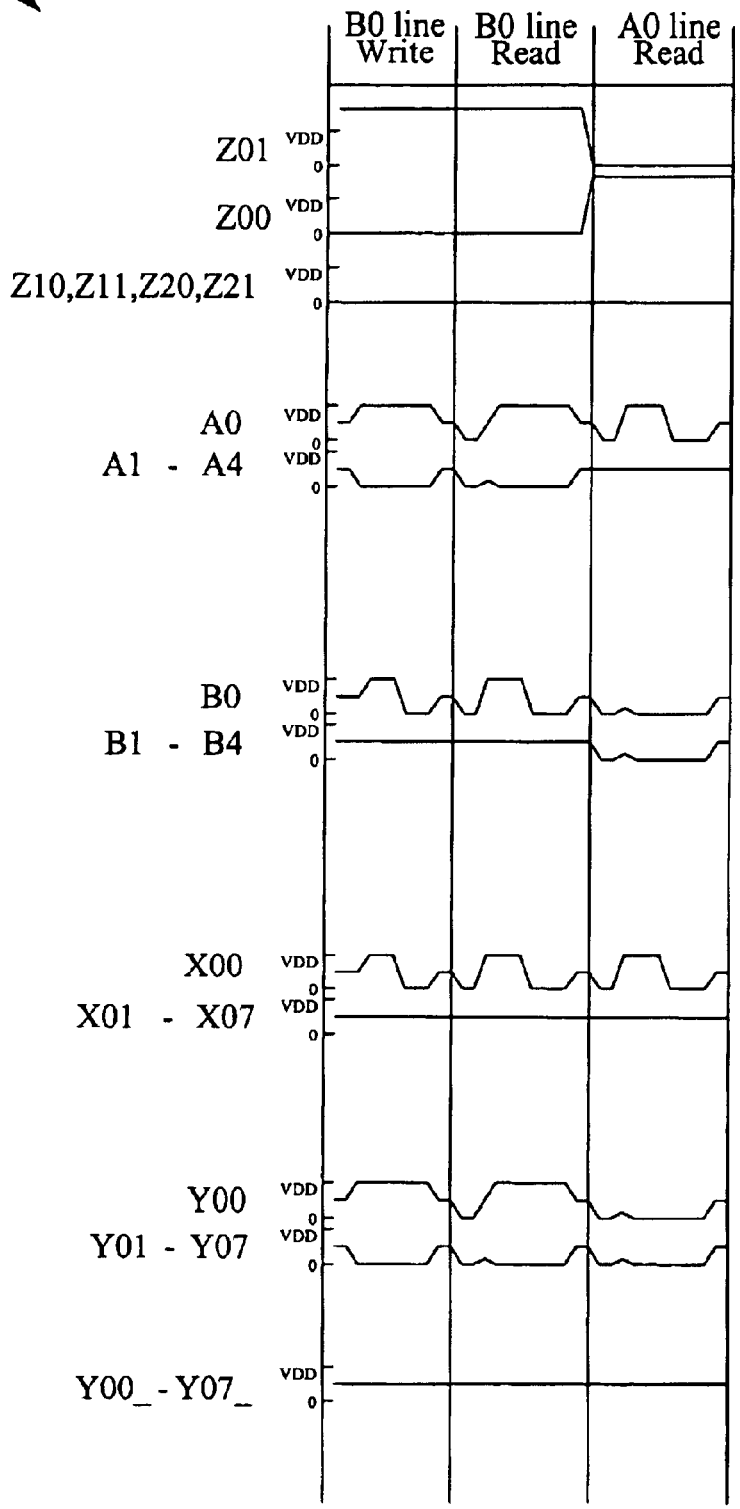
FIG. 8 is a timing diagram further illustrating operation of the memory device of FIGS. 6A, 6B, and 7.

Another exemplary implementation of the invention is illustrated in FIGS. 6A, 6B, 7, and 8, wherein FIGS. 6A and 6B illustrate a portion 304a of a memory array 304 with ferroelectric memory cells $C_{00}$–$C_{33}$ arranged in a diamond configuration along perpendicular routing lines A0–A3 and B0–B3, referred to hereinafter as row lines and column lines, respectively. FIG. 7 illustrates an exemplary open bitline memory device 302 using the memory portion 304a of FIGS. 6A and 6B. As shown in FIGS. 6A, 6B, and 7, the exemplary memory device 302 comprises a memory array portion 304a, wherein a plurality of ferroelectric memory cells or capacitors $C_{rc}$ are arranged in four columns and four rows along column lines B0–B3 and row lines A0–A3, respectively. The individual memory cells comprise a single ferroelectric capacitor $C_{rc}$ having terminals coupled with a single row line "A" and a single column line "B" in the array portion 304a.

A sense amp block 318 (FIG. 7) comprises eight differential sense amps, each having a complimentary pair of inputs, with one of each pair connected into the array 304 along routing lines Y00–Y07, and the other connected to a reference generator 308. The sense amp inputs along the lines Y00–Y07 are adapted to read or write a memory cell data state when a memory cell is coupled therewith via the routing lines Y00–Y07. The exemplary memory device 302 also provides a decoder 310 selectively providing a plateline output signal to one of a series of routing lines X00–X07 according to address information 312 for a selected row or column during a read or write operation. The array portion 304a is accessed using the lines Y00–Y03 and X00–X03, as illustrated in FIG. 7. As with the device 202 above, the sense amp block 318 and the decoder 310 are used in both column and row-wise memory access operations to read or write cells in the array 304.

As illustrated in FIG. 6A, the exemplary memory device 302 also comprises a selector system 316 coupled with the row lines A0–A3, the column lines B0–B3, the sense amps through lines Y00–Y03, and the decoder outputs through lines X00–X03, wherein the other array portions 304b–304e (FIG. 7) are provided with equivalent circuitry of the selector system 316 (not shown). With respect to the exemplary array portion 304a, the selector system 316 selectively couples at least one of the row lines A0–A3 with one of the decoder outputs along the lines X00–X03 and couples the column lines B0–B3 with the sense amp inputs along the lines Y00–Y03 to read or write a row of memory cells. In addition, the selector system 316 allows column-wise access by coupling at least one of the column lines B0–B3 with one of the decoder outputs along the lines X00–X03 and couples the row lines A0–A3 with the sense amp inputs along the lines Y00–Y03 to read or write a column of memory cells in the array portion 304a.

The exemplary selector system 316 comprises four switching circuits 322a–322d, as shown in FIG. 6A. The switching circuits 322 are individually coupled with one of the row lines A0–A3, one of the column lines B0–B3, one of the sense amp inputs along the routing lines Y00–Y07, and one of the decoder outputs along the routing lines X00–X07. For example, in FIG. 6A, the illustrated switching circuit 322a is coupled with the row line A0, the column line B0, the input to the sense amp along the routing line Y00, and the decoder output along the line X00.

The switching circuit 322a selectively couples the row line A0 with the decoder output along the routing line X00 and couples the column line B0 with the sense amp input along the routing line Y00 during a row read or a row write operation. During a column operation, the switching circuit 322a couples the column line B0 with the decoder output along the line X00 and couples the row line A0 with the sense amp input along the line Y00, wherein the other switching circuits 322b–322d operate in similar fashion as shown in FIG. 6A. Thus, the selector system 316 provides selective access for row-wise or column-wise memory operations in the array portion 304a according to selector control signals Z00 and Z01 from a selector control circuit 314, as illustrated further in a timing diagram 340 in FIG. 8. In the timing diagram 340 of FIG. 8, it is noted that since the cell terminal connection is opposite between row access and column access, the output state is also opposite, for example, during read operations. Accordingly, data inversion circuitry (not shown) may be provided between the sense amp/write buffer block 318 and the IO lines of the memory device 302 to selectively invert read data during column or row read operations, wherein any appropriate inversion circuitry may be employed for this purpose.

The selector control circuit 314 operates to provide the signals Z00 and Z01 to the array portion 304a, as well as signals Z10, Z11, Z20, and Z21 to the other array portions 304b–304e in the device 302 (FIG. 7). The address information 312 is employed by the decoder 310 to provide a decoder output to the selected row or column of interest in the array 304 in the form of a plateline pulse or other signal during a read or write operation. The control signals Z00 and Z01 thus operate the individual switching circuits 322 in the array portion 304a to employ the sense amps in the block 318 to read or write a row of four cells (e.g., such as cells $C_{00}$, $C_{01}$, $C_{02}$, $C_{03}$, and $C_{04}$, along the row line A0) or a row of four cells (e.g., such as cells $C_{00}$, $C_{10}$, $C_{20}$, $C_{30}$, and $C_{40}$, along the column line B0 ). Any appropriate selector control circuitry may be provided in accordance with the invention to provide gating signals to the switching devices of the switching circuits 322. As illustrated in FIG. 6A, moreover, the exemplary switching circuits 322 individually comprise four MOS transistor switches, although any appropriate switching device may be employed in accordance with the invention.

In the exemplary switching circuitry of the device 302, the top switching circuit 322a comprises a first switching device $Q_{12}$ adapted to electrically connect the column line B0 to the decoder output along the line X00, and a second switching device $Q_{11}$ adapted to electrically connect the row line A0 to the sense amp input along the routing line Y00 during a column read or write operation when the control signal Z01 is active high. In addition, the circuit 322a comprises a third switching device $Q_2$ adapted to electrically connect the row line A0 to the decoder output along the routing line X00 during a row read or write operation, and a fourth switching device $Q_1$ to electrically connect the column line B0 to the sense amp input along line Y00 during a row read or write operation.

Figure 9A:
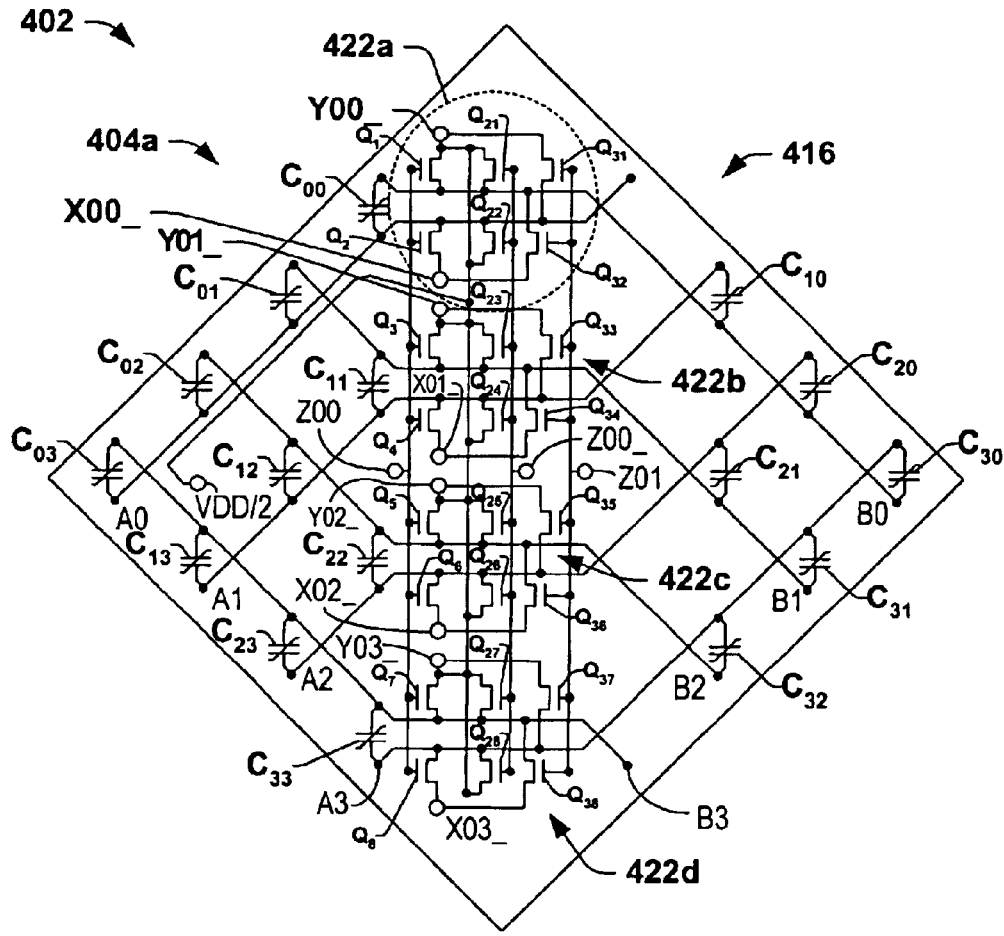
FIGS. 9A and 9B are schematic diagrams illustrating a portion of another exemplary memory device in accordance with the invention.
Figure 9B:
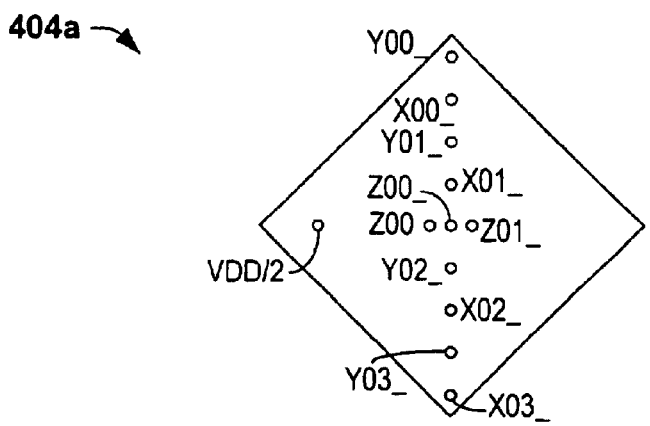

Still another exemplary memory device 402 is illustrated in FIGS. 9A and 9B, where a portion 404a of a memory array 404 with ferroelectric memory cells $C_{00}$–$C_{33}$ is arranged in a diamond configuration along perpendicular routing lines A0–A3 and B0–B3, referred to hereinafter as row lines and column lines, respectively. As illustrated in FIG. 9A, the device 402 comprises a memory array portion 404a, in which a plurality of ferroelectric memory cells or capacitors $C_{rc}$ are arranged in four columns and four rows along column lines B0–B3 and row lines A0–A3, respectively. The individual memory cells comprise a single ferroelectric capacitor $C_{rc}$ having terminals coupled with a single row line "A" and a single column line "B".

As with the above device 302, a sense amp block (not shown) may be provided, which comprises a number of differential sense amps, wherein each sense amp has a complimentary pair of inputs, with four input terminals connected into the array portion 404a along lines Y00__, Y01__, Y02__, and Y03__, and with the complimentary inputs receiving a reference voltage during read operations along lines Y00, Y01, Y02, and Y03 from reference voltage circuitry (not shown). The sense amp inputs along the lines Y00/Y00__–Y03/Y03__ are adapted to read or write a memory cell data state when a memory cell is coupled therewith. The exemplary memory device 402 further comprises a decoder block circuit (not shown), which selectively provides a plateline output signal to one of a series of routing lines X00/X00__–X03/X03__ according to address information for a selected row or column during a read or write operation, wherein the sense amp block and the decoder are used in both column and row-wise memory access operations to read or write cells in the array portion 404a. In this regard, any appropriate sense amp block and decoder block circuitry may be employed in accordance with the invention, for example, such as those illustrated and described above with respect to FIG. 7.

The ferroelectric memory device 402 further comprises a selector system 416 coupled with the row lines A0–A3, the column lines B0–B3, the sense amps through lines Y00__–Y03__, and the decoder outputs through lines X00__–X03__ in the portion 404a of FIG. 9A. The selector system 416 operates to couple one of the row lines A0–A3 with one of the decoder outputs on lines X00__–X03__ and to couple the column lines B0–B3 with the sense amp inputs along lines Y00__–Y03__ in order to read or write a row of memory cells. In addition, the selector system 416 provides column-wise access by coupling one or more of the column lines B0–B3 with decoder outputs and couples the row lines A0–A3 with the sense amp inputs along lines Y00__–Y03__ in order to read or write a column of memory cells in the array portion 404a.

The exemplary selector system 416 comprises four switching circuits 422a–422d, as shown in FIG. 9A. The switching circuits 422 are coupled with one of the row lines A0–A3, one of the column lines B0–B3, one of the sense amp inputs along the routing lines Y00__–Y03__, and with one of the decoder outputs along the routing lines X00__–X03__. In the portion 404a of FIG. 9A, the exemplary switching circuit 422a is coupled with the row line A0, the column line B0, the input to the sense amp block 418 along the routing line Y00__, and with the decoder block output along the line X00__. The switching circuit 422a is adapted to couple the row line A0 with the decoder output along the line X00__ and to couple the column line B0 with the sense amp block input along the line Y00__ during a row read or write operation. In addition, the switching circuit 422a couples the column line B0 with the decoder output along the line X00__ and couples the row line A0 with the sense amp input along the line Y00__ during a column-wise read or write operation, wherein the other switching circuits 422b–422d operate in similar fashion as shown in FIG. 9A.

The selector system 416 thereby provides selective access for row-wise or column-wise memory operations in the array portion 404a according to selector control signals Z00 and Z01 from a selector control block (not shown). The selector control block circuit provides the signals Z00 and Z01 to the array portion 404a. The decoder block employs address information to provide a decoder output (e.g. a plate line signal) to the selected row or column of interest in the array 404. In the array portion 404a, the control signals Z00 and Z01 operate the individual switching circuits 422a–422d to employ the sense amps to read or write a column of four cells or a row of four cells.

As illustrated in FIG. 9A, the exemplary switching circuits 422 individually comprise six MOS transistor switches, although any appropriate switching devices may be employed in accordance with the invention. The top switching circuit 422a comprises a first switching device $Q_{32}$ adapted to electrically connect the column line B0 to the decoder output along the line X00__, and a second switching device $Q_{31}$ adapted to electrically connect the row line A0 to the input to the sense amp along the line Y00__ during a column read or write operation when the control signal Z01 is active high. In addition, the circuit 422a comprises a third switching device $Q_2$ adapted to electrically connect the row line A0 to the decoder output line X00__ during a row read or write operation, and a fourth switching device $Q_2$, to electrically connect the column line B0 to the sense amp input along line Y00__ during a row read or write operation. Q12 and Q22 operate to connect the ferroelectric capacitor terminals to a fixed voltage (e.g., VDD/2), to prevent or mitigate disturbance by decoder output lines or by sense amp input lines through coupling capacitance during other cell array access operations. In addition, these transistors Q12 and Q22 help to prevent disturbance due to charge injection from alpha particle or from nearby circuitry, wherein connection to a fixed voltage such as VDD/2 is provided by these transistors for providing a fixed voltage to the ferroelectric capacitors.

Figure 10A:
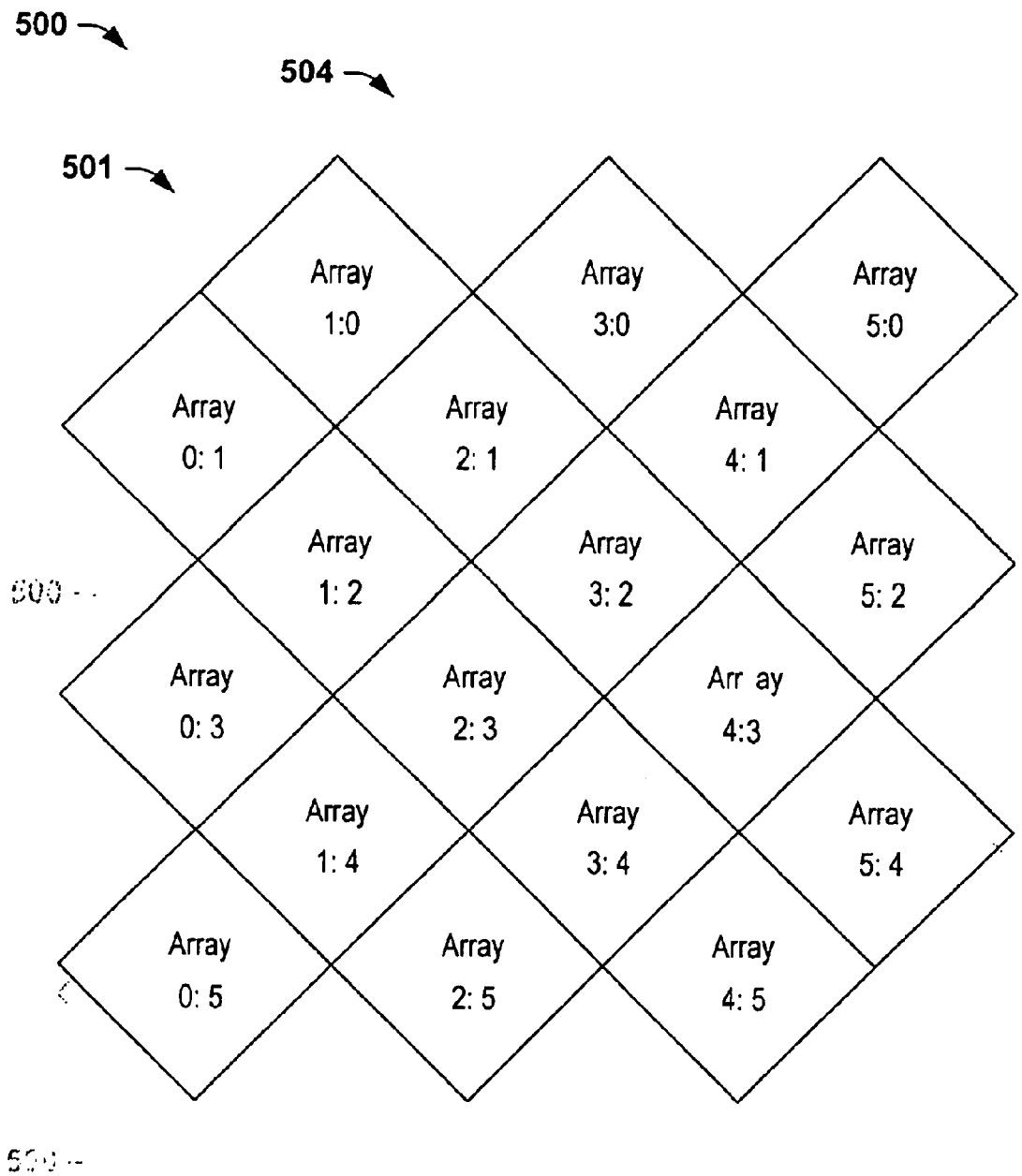
FIG. 10A is a schematic diagram illustrating another exemplary array placement in accordance with the invention.
Figure 10B:
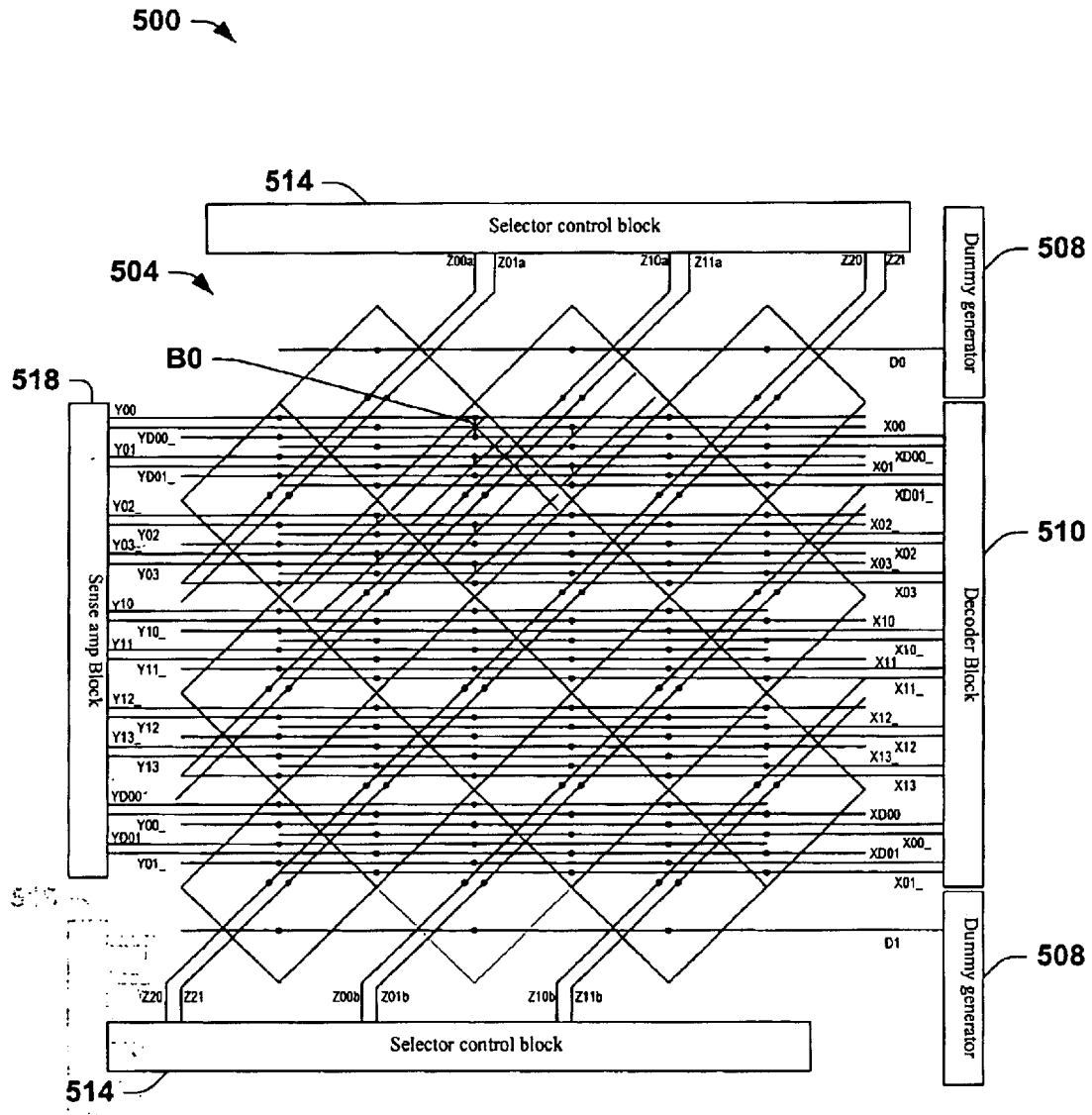
FIG. 10B is a schematic diagram illustrating another exemplary memory device including the array placement of FIG. 10A in accordance with the invention.
Figure 10C:
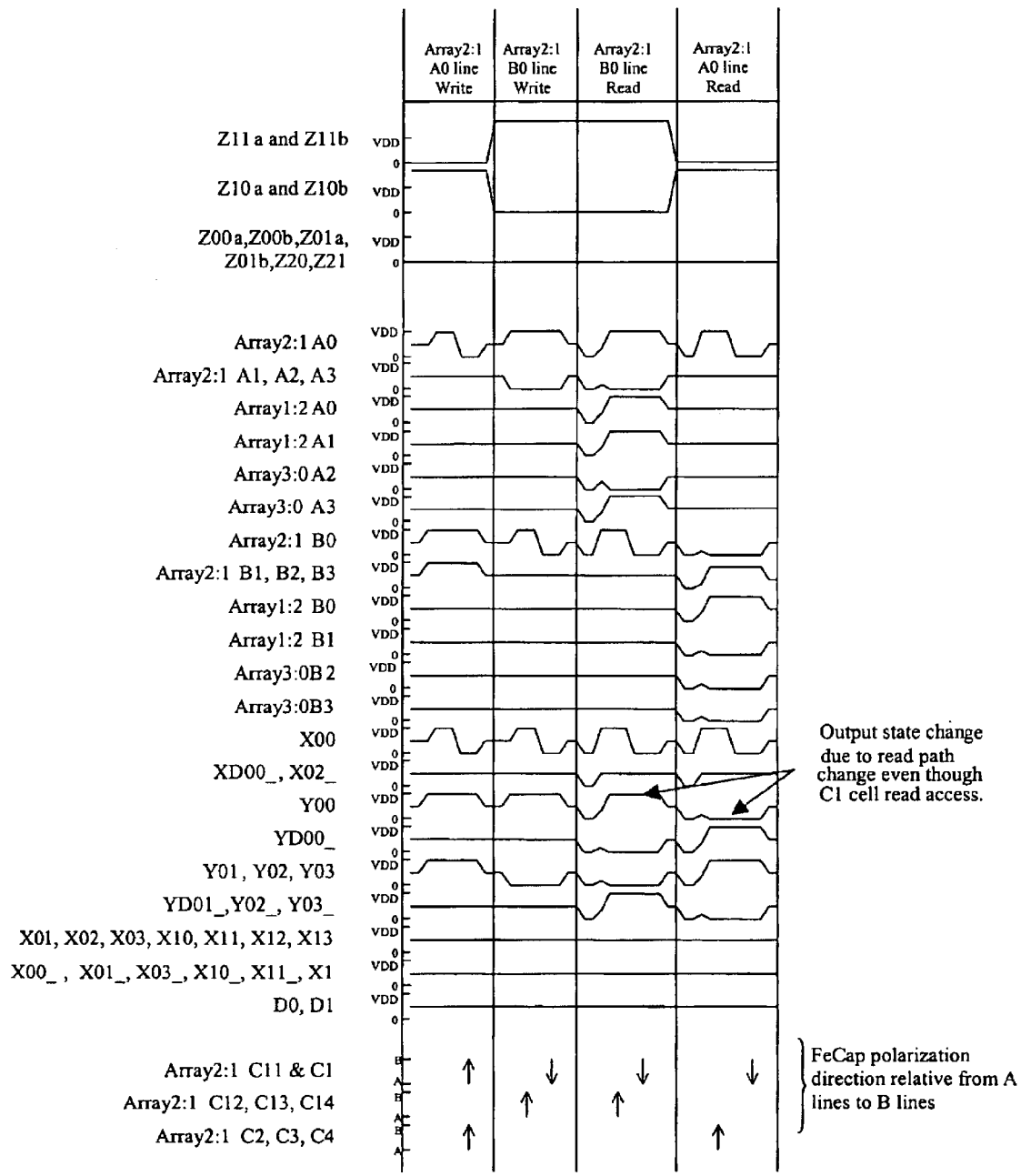
FIG. 10C is a timing diagram illustrating operation of the memory device of FIGS. 10A and 10B.

Referring now to FIGS. 10A–10G, another exemplary memory folded bitline ferroelectric memory device 500 is illustrated in accordance with the present invention. FIG. 10A illustrates an exemplary array placement 501 for the device 500 using an array 504 comprising array portions similar to the memory array portion 304a of FIG. 6A. FIG. 10B shows further details of the memory device 500 including circuitry for reading and writing rows or columns of the array 504, and FIG. 10C provides a timing diagram 530 illustrating operation of the device 500. As illustrated in FIG. 10B, the ferroelectric memory device 500 comprises an array 504 having a plurality of such memory array portions (e.g., 304a), wherein a plurality of ferroelectric memory cells or capacitors $C_{fc}$ are arranged in columns and rows along column lines B0–B3 and row lines A0–A3, respectively, as described above. In the array 504, the array portions Array 0:1, Array 2:1, Array 4:1, Array 1:2, Array 3:2, Array 5:2, Array 0:3, Array 2:3, Array 4:3, Array 1:4, Array 3:4, and Array 5:4 are similar to the exemplary array portion 304a above. In addition, dummy cell array portions 504', including Array 1:0, Array 3:0, and Array 5:0, are provided, as illustrated below with respect to FIGS. 10F and 10G, and further dummy cell array portions 504' Array 0:5, Array 2:5, and Array 4:5 are provided inverse (e.g., upside-down) to that illustrated in FIGS. 10F and 10G.

A sense amp block 518 is provided, comprising eight differential sense amps, each having a complimentary pair of inputs, with one of each pair connected into the array 504 along routing lines Y00/Y00__–Y13/Y13__, and the other connected to a dummy cell reference generator 508, and further comprising dummy cell main bitlines YD/YD__ as illustrated. The sense amp inputs are adapted to read or write a memory cell data state when a memory cell is coupled therewith via the routing lines Y00/Y00__–Y13/Y13__. The device 502 further comprises a decoder 510 selectively providing a plateline output signal to one of a series of routing lines X00/X00__–X13/X13__ according to address information (not shown) for a selected row or column during a read or write operation. Further, a selector system is provided, (e.g., similar to the exemplary system 316 illustrated and described above) coupled to the row and column lines in the array portions 504, as well as to the sense amps, and the decoder outputs.

Operation of the exemplary device 500 is further illustrated in the timing diagram 530 of FIG. 10C, wherein the selector system selectively couples at least one of the row lines in a given array portion of interest with one of the decoder outputs and couples the column lines thereof with the sense amp inputs to read or write a row of memory cells. In addition, the selector system of the device 500 provides column-wise access by coupling at least one of the column lines of the array portions with one of the decoder outputs and couples the row lines thereof with the sense amp inputs to read or write a column of memory cells in the array 504.

Figure 10D:
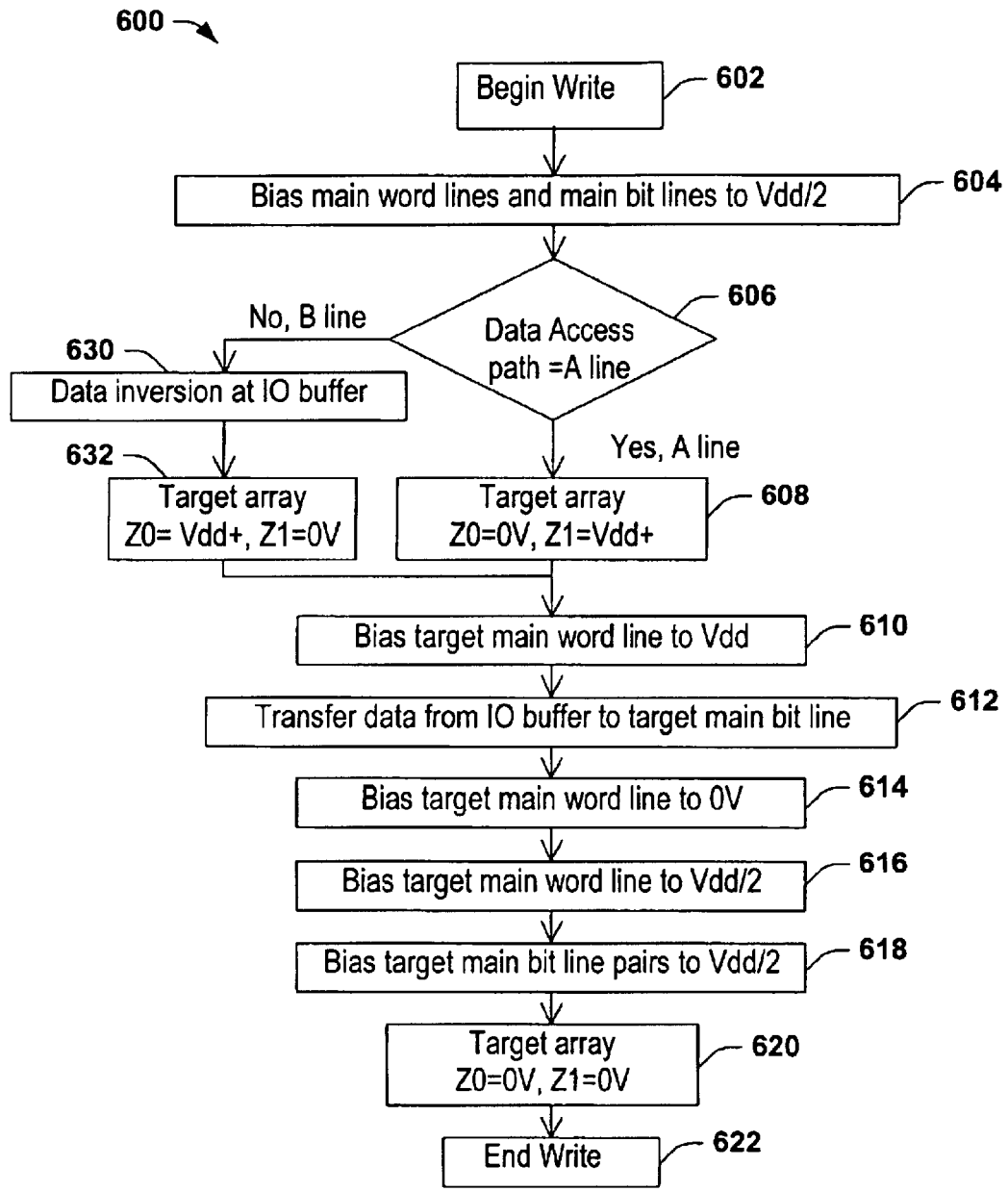
FIG. 10D is a flow diagram illustrating a data write operation in the device of FIGS. 10A–10C.

Referring to FIG. 10D, an exemplary method 600 is illustrated for performing a write operation (e.g., a row write or a column write) in the device 500. Although the exemplary method 600 is illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. It is further noted that the methods according to the present invention may be implemented in association with the memory devices illustrated and described herein as well as in association with other devices and structures not illustrated.

Beginning at 602, the method 600 comprises biasing main word lines (e.g., X00, X01, X02, X03, X10, X11, X12, X13, X00__, X01__, X02__, X03__, X10__, X11__, X12__, and X13__) and main bitlines (e.g., Y00, Y01, Y02, Y03, Y10, Y11, Y12, Y13, Y00__, Y01__, Y02__, Y03__, Y10__, Y11$_{13}$, Y12__, and Y13__) to VDD/2 at 604. A determination is made at 606 as to whether the desired data path is one of the A lines (e.g., A0, A1, A2, or A3, in the array portions 403a of FIG. 6A) for a row write. If so, the control signal Z0 is set to 0V and signal Z1 is set to VDD+ by the selector control block 514 at 608 for a row write. If not, data is inverted at 630 using an IO buffer (not shown), and the selector control block 514 sets Z0=VDD+ and Z1=0V at 632. The method 600 then proceeds to 610, where the target one of the main word lines (e.g., X00, X01, X02, X03, X10, X11, X12, X13, X00__, X01__, X02__, X03__, X10__, X11__, X12__, or X13__) are biased or set to VDD. At 612, data is transferred from the IO buffer (e.g., using the sense amp block 518) to the target main bitlines, and the target main word lines are then biased to 0V at 614. The target main word lines are then biased to VDD/2 at 616, and the target main bitline pairs are then biased to VDD/2 at 618. The control signal Z0 is then set to 0V and Z1 is set to 0V at 620, before the write method 600 ends at 622.

Figure 10E:
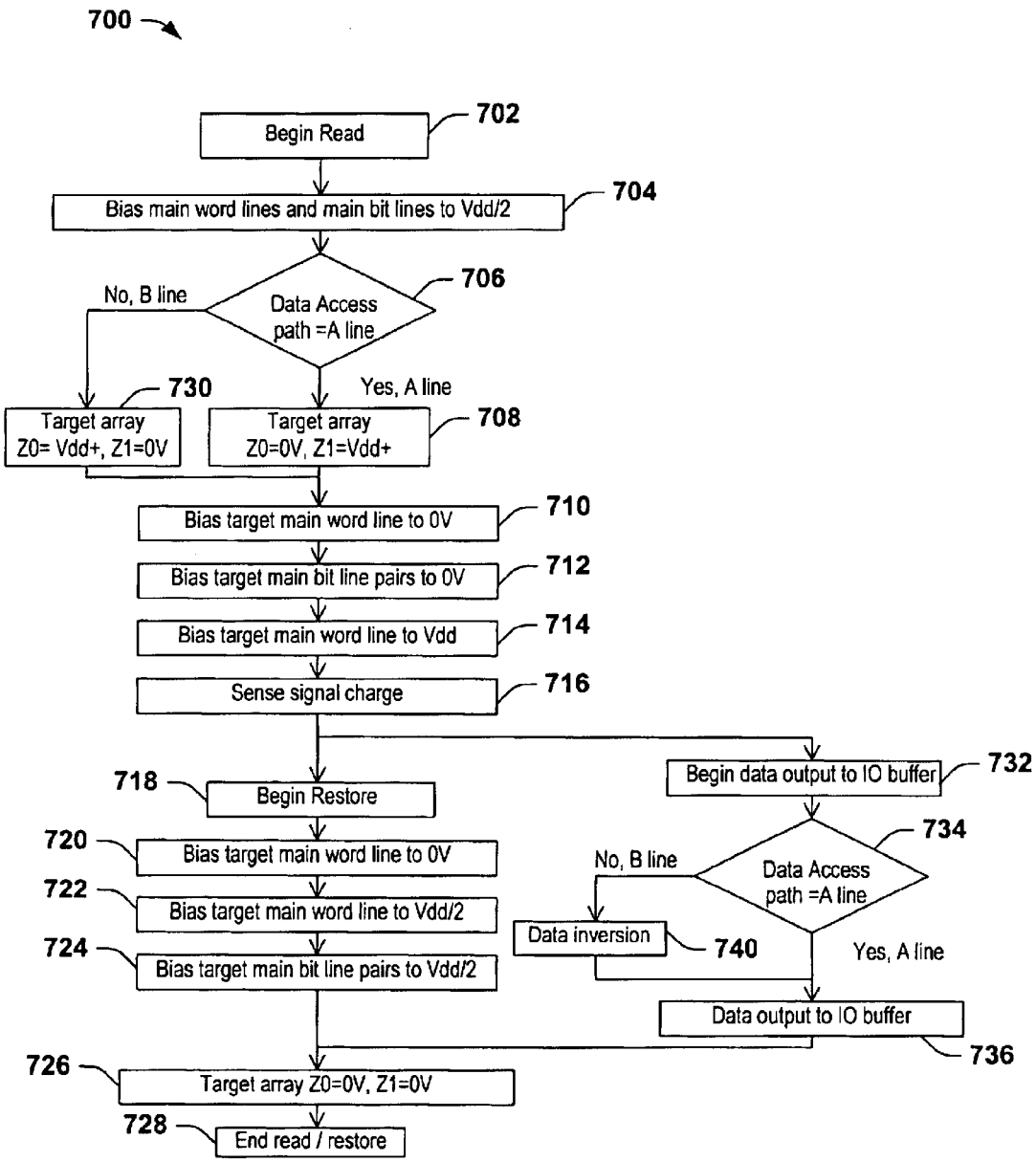
FIG. 10E is a flow diagram illustrating a data read operation in the device of FIGS. 10A–10C.
Figure 10F:
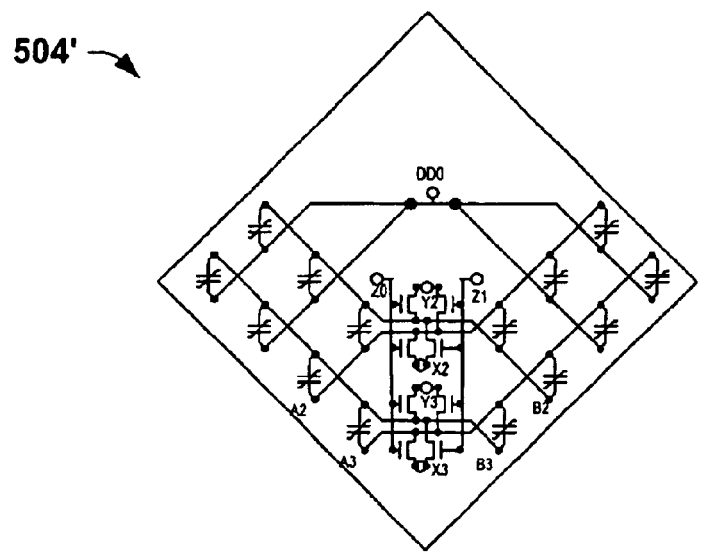
FIGS. 10F and 10G are schematic diagrams illustrating an exemplary dummy cell unit for the device of FIGS. 10A–10C.
Figure 10G:
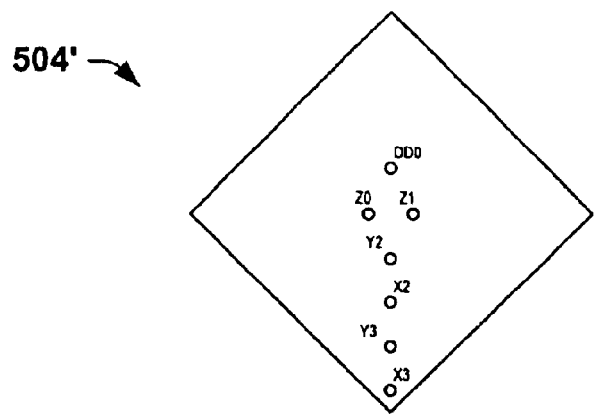

Referring to FIG. 10E, an exemplary method 700 is illustrated for performing a read operation (column or row) in the device 500. Although the exemplary method 700 is illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. It is further noted that the methods according to the present invention may be implemented in association with the memory devices illustrated and described herein as well as in association with other devices and structures not illustrated.

Beginning at 702, the method 700 comprises biasing the main word lines and the main bitlines to VDD/2 at 704. A determination is made at 706 as to whether the desired data path is one of the A lines for a row read. If so, the control signal Z0 is set to 0V and signal Z1 is set to VDD+ by the selector control block 514 at 708 (e.g., row read operation), and if not, the selector control block 514 sets Z0=VDD+ and Z1=0V at 730 (e.g., column read). The method 700 then proceeds to 710, where the target main word line is biased to 0V, and the target main bitline pairs are biased to 0V at 712. The target main wordline is then biased at 714 to VDD, and the resulting signal charge is sensed (e.g., by the sense amp block 514) at 716. The read data is then concurrently restored to the memory cells of the array 504 (718–728 below), as well as buffered out to IO buffer circuitry (732–736 below).

At 718, the data restore begins. The target main wordline is first biased to 0V at 720, and then to VDD/2 at 722, and the target main bitline pairs are biased to VDD/2 at 724. The selector control block 514 then sets Z0=0V and Z1=0V at 726 before the method 700 ends at 728. Concurrently with the restore operation, the method 700 proceeds to 732 to provide the data output to the IO buffer, wherein a determination is made at 734 as to whether the desired data path is one of the A lines for a row read. If so, the data is output to the IO buffer without any inversion at 736. If not (e.g., column read), the data is inverted at 740, and then output to the IO buffer at 736, before the selector control block 514 sets Z0=0V and Z1=0V at 726, and the method 700 ends at 728.

Figure 11:
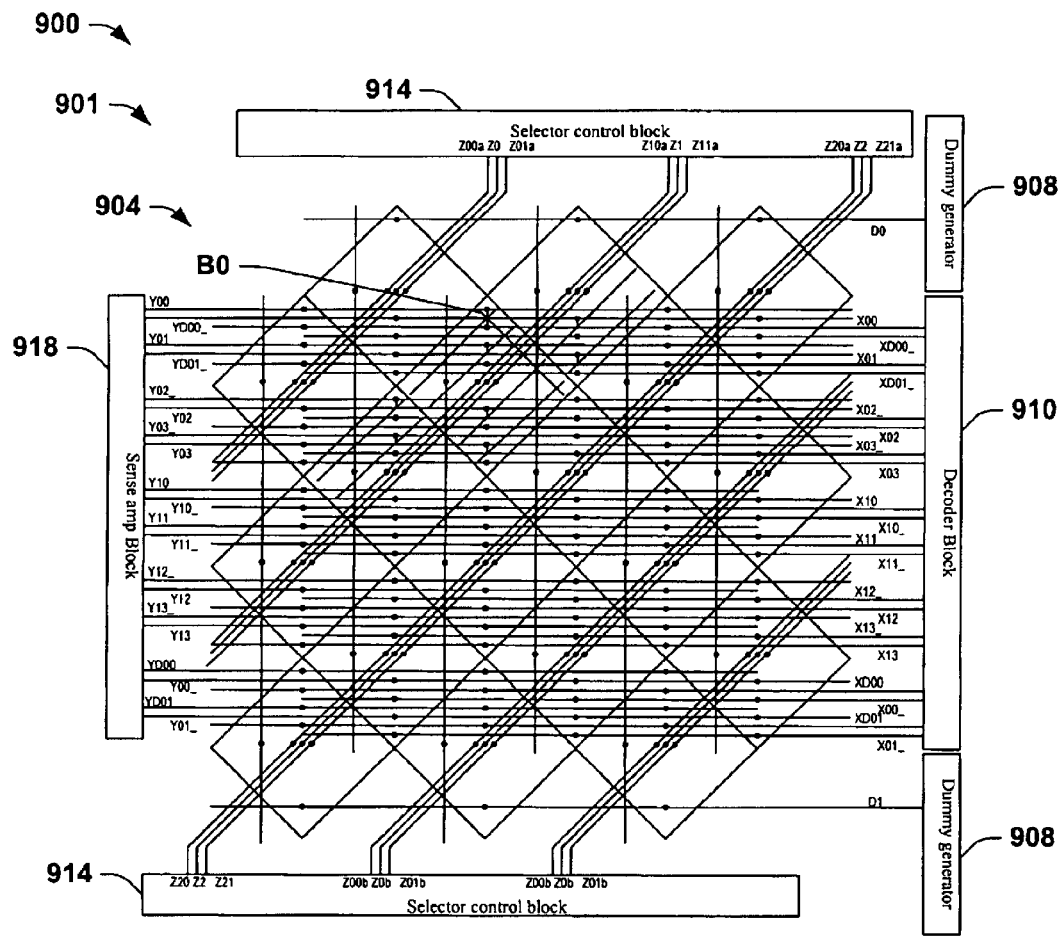
FIG. 11 is a schematic diagram illustrating another exemplary memory device in accordance with the present invention.

Referring now to FIG. 11, another exemplary ferroelectric memory device 900 is illustrated in accordance with the invention. The device 900 comprises an exemplary array placement 901 similar to the array placement 501 in FIG. 10A above for a ferroelectric memory cell array 904, again comprising array portions similar to the memory array portion 304a of FIG. 6A. The array 904 comprises a plurality of such memory array portions (e.g., 304a), with a plurality of ferroelectric memory cells or capacitors arranged in columns and rows along column lines B0–B3 and row lines A0–A3, respectively, as described above, wherein certain of the array portions are similar to the exemplary array portion 304a above, and others (e.g., dummy cell array portions) are similar to the dummy cell portion 504' illustrated in FIGS. 10F and 10G above.

A sense amp block 918 is provided, comprising eight differential sense amps, each having a complimentary pair of inputs, with one of each pair connected into the array 904 along routing Y direction lines Y00/Y00__–Y13/Y13__, and the other connected to a dummy cell reference generator 908, and further comprising dummy cell main bitlines YD/YD__ as illustrated. The sense amp inputs are adapted to read or write a memory cell data state when a memory cell is coupled therewith via the routing lines Y00/Y00__–Y13/Y13__. The device 900 further comprises a decoder 910 selectively providing a plateline output signal to one of a series of routing lines X00/X00__–X13/X13__ according to address information (not shown) for a selected row or column during a read or write operation. Further, a selector system is provided, (e.g., similar to the exemplary system 316 illustrated and described above) coupled to the row and column lines in the array portions 904, as well as to the sense amps, and the decoder outputs.

Figure 12A:
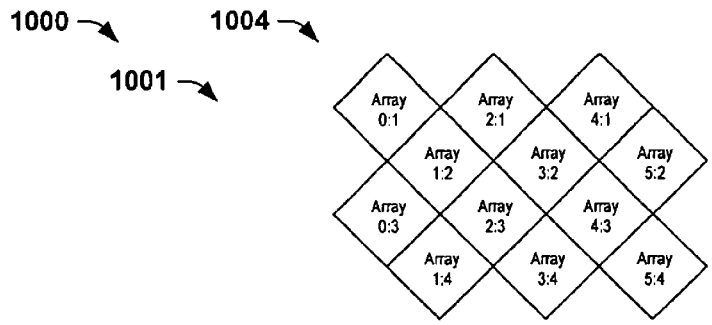
FIG. 12A is a schematic diagram illustrating another exemplary array placement in accordance with the invention.
Figure 12B:
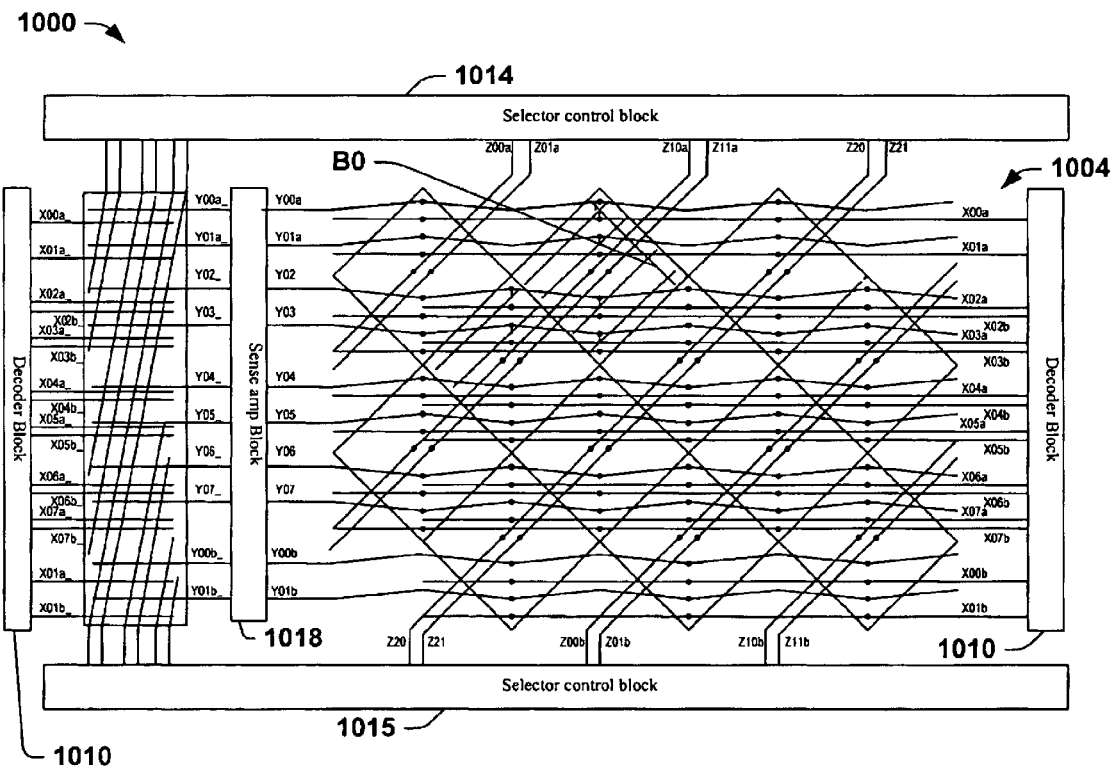
FIG. 12B is a schematic diagram illustrating another exemplary memory device including the array placement of FIG. 12A in accordance with the invention.
Figure 13:
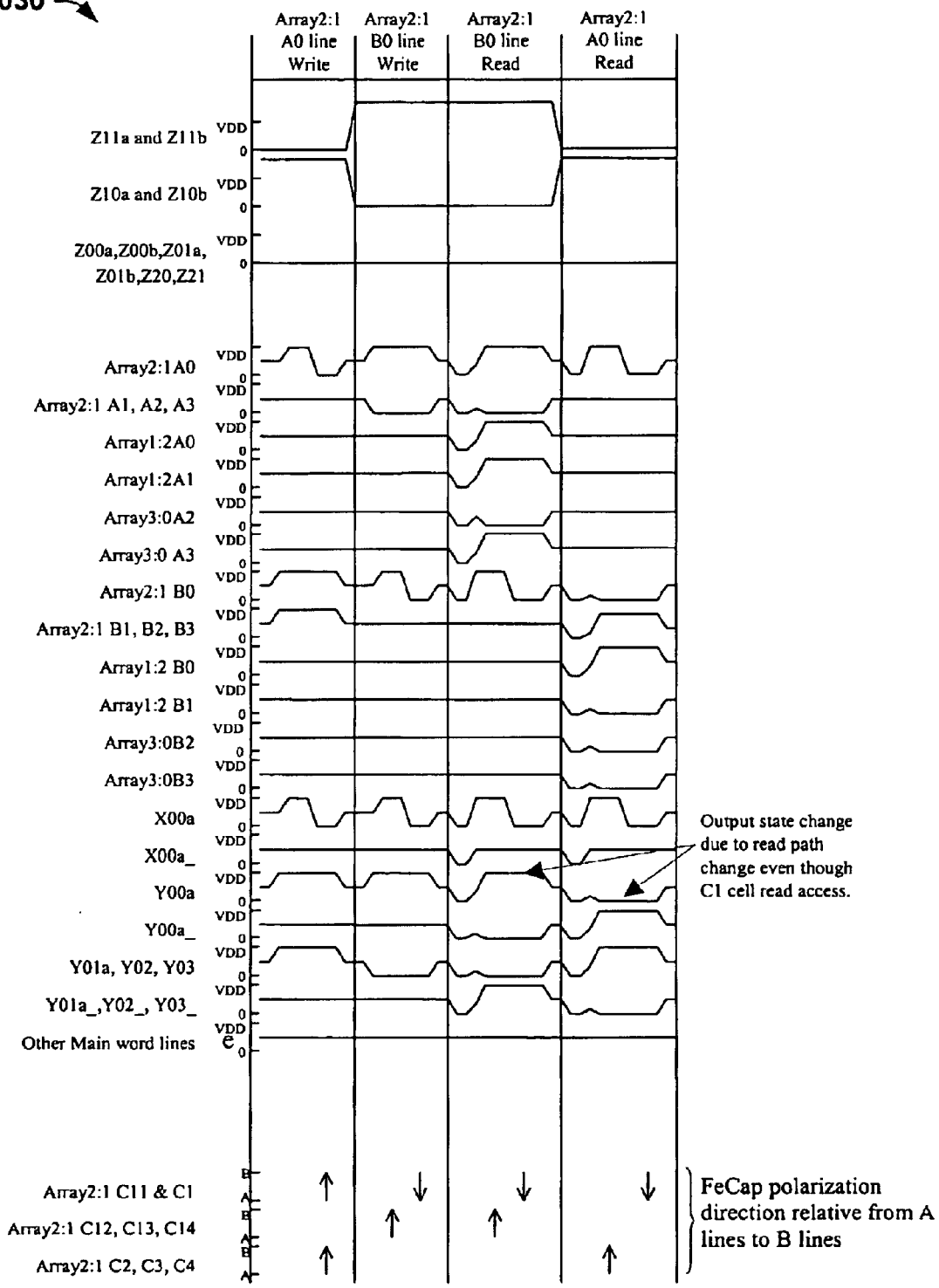
FIG. 13 is a timing diagram illustrating operation of the memory device of FIGS. 12A and 12B.

Referring now to FIGS. 12A, 12B, and 13, still another exemplary ferroelectric memory device 1000 is illustrated in accordance with the invention. FIG. 12A illustrates an exemplary array placement 1001 for the device 1000 using an array 1004 comprising array portions similar to the memory array portion 304a of FIG. 6A. FIG. 12B shows further details of the memory device 1000 including circuitry for reading and writing rows or columns of the array 1004, and FIG. 13 provides a timing diagram 1030 illustrating operation of the device 1000. The ferroelectric memory device 1000 comprises an array 1004 having a plurality of memory array portions (e.g., portion 304a above), in which a plurality of ferroelectric memory cells or capacitors $C_{rc}$ are arranged in columns and rows along column lines B0–B3 and row lines A0–A3, respectively. The device 1000 also comprises a sense amp block 1018, which comprises eight differential sense amps, each having a complimentary pair of inputs, with one of each pair connected into the array 1004, and the other connected to a decoder block 1010 for provision of a reference voltage during read operations, wherein the sense amp inputs are adapted to read or write a memory cell data state when a memory cell is coupled therewith via the Y direction lines in FIG. 12B.

The device 1000 further comprises a decoder 1010 selectively providing a plateline output signal to one of a series of routing lines X00a–X07b according to address information (not shown) for a selected row or column during a read or write operation. Further, a selector system is provided, (e.g., similar to the exemplary system 316 illustrated and described above) coupled to the row and column lines in the array portions 1004, as well as to the sense amps, and the decoder outputs. The operation of the memory device 1000 is illustrated in the timing diagram 1030 of FIG. 13, wherein the selector system selectively couples at least one of the row lines in a given array portion of interest with one of the decoder outputs and couples the column lines thereof with the sense amp inputs to read or write a row of memory cells. In addition, the selector system of the device 1000 provides column-wise access by coupling at least one of the column lines of the array portions with one of the decoder outputs and couples the row lines thereof with the sense amp inputs to read or write a column of memory cells in the array 1004.

Figure 14A:
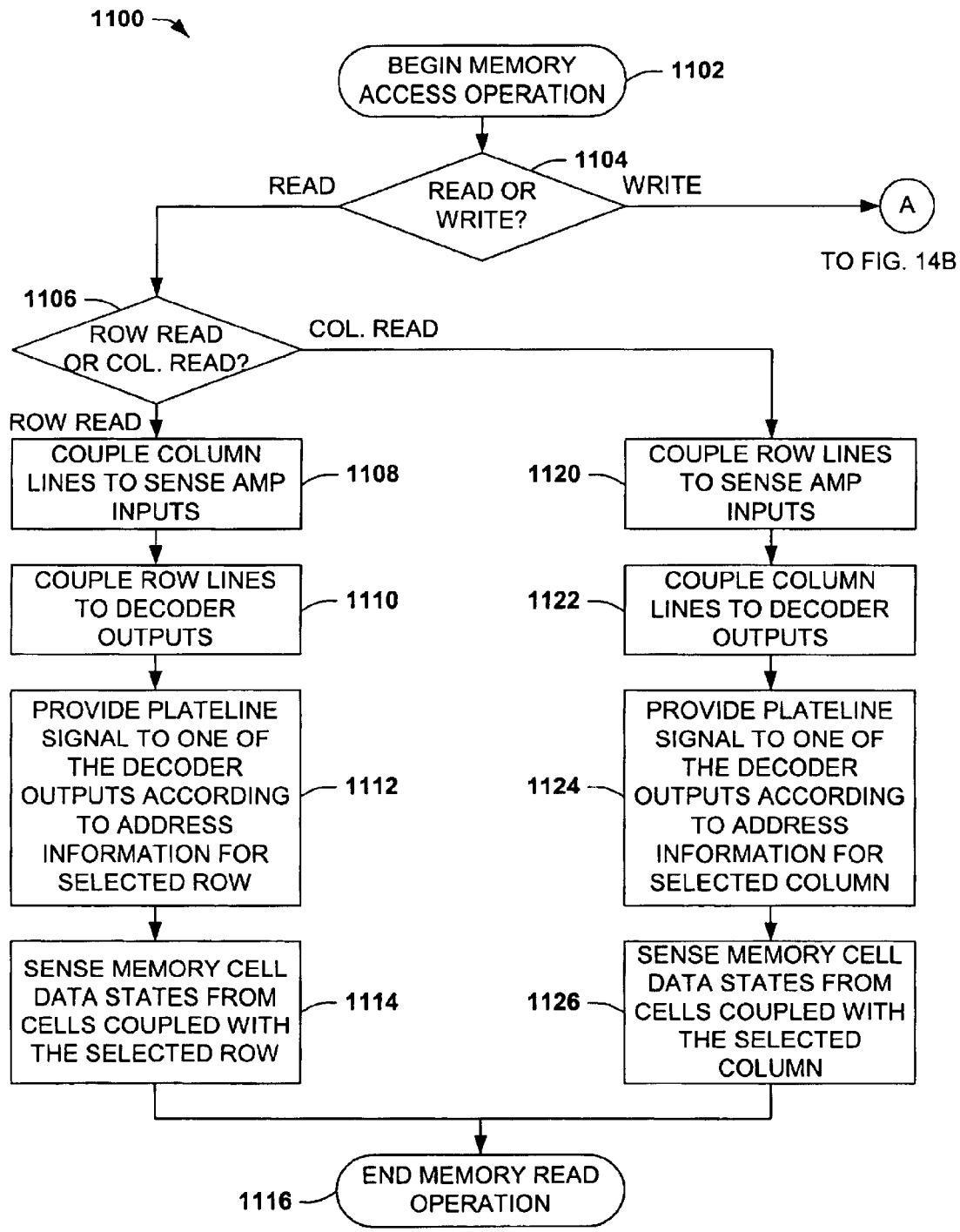
FIGS. 14A and 14B provide a flow diagram illustrating an exemplary method of accessing a row or a column of cells in a ferroelectric memory array in accordance with another aspect of the present invention.

Yet another aspect of the present invention provides methods for reading and/or writing a row or a column of ferroelectric memory cells in a memory array. One exemplary method 1100 is illustrated and described hereinafter with respect to FIGS. 14A and 14B, according to the invention. Although the exemplary method 1100 is illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. It is further noted that the methods according to the present invention may be implemented in association with the memory devices illustrated and described herein as well as in association with other devices and structures not illustrated.

Beginning at 1102, the memory access operation begins with a determination of whether the operation is a read or a write at 1104. If the access is for reading, a determination is then made at 1106 as to whether a column or a row is to be read. If the operation is a row read, the method 1100 proceeds to 1108, whereat the column lines are coupled with the sense amp inputs (e.g., column lines c00–c04 of FIG. 4A are coupled with the inputs to sense amps S/A00–S/A04 along lines Y00–Y04, respectively). The row lines (e.g., lines r00–r04 in FIG. 4A) are coupled at 1110 with the decoder outputs (e.g., decoder outputs DO00–DO04 of FIG. 4A). At 1112, a plateline signal is provided to one of the row lines (e.g., via a decoder output, such as DO00 in FIG. 4A), and the memory cell data states are read or sensed at 1114 from the memory cells coupled with the selected row (e.g., cells $C_{00}$, $C_{01}$, $C_{02}$, $C_{03}$, and $C_{04}$ along the row line r00 in FIG. 4A), before the row read operation ends at 1116.

If the operation is a column read at 1106, the method 1100 proceeds to 1120, where the row lines are coupled with the sense amp inputs (e.g., row lines r00–r04 of FIG. 4A are coupled with the inputs to sense amps S/A00–S/A04 along lines Y00–Y04, respectively). In addition, the column lines (e.g., lines c00–c04 in FIG. 4A) are coupled at 1122 with the decoder outputs (e.g., decoder outputs DO00–DO04 of FIG. 4A). At 1124, a plateline signal is provided to one of the column lines via the decoder outputs (e.g., output DO00 in FIG. 4A). At 1126, the memory cell data states are read or sensed at 1114 from the memory cells coupled with the selected column (e.g., cells $C_{00}$, $C_{10}$, $C_{20}$, $C_{30}$, and $C_{40}$ along the column line c00 in FIG. 4A), and the column read operation ends at 1116.

Figure 14B:
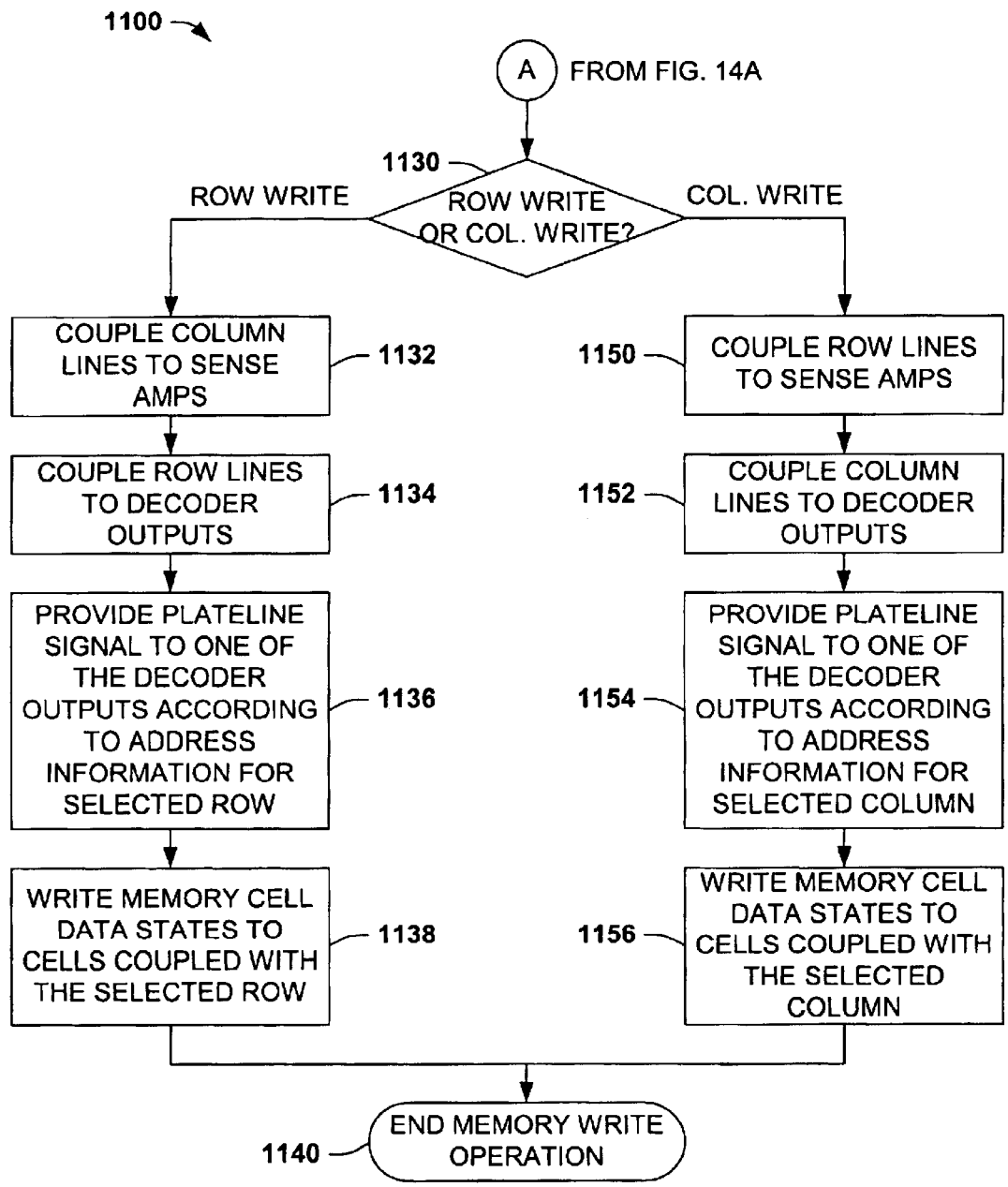

For a row or column write operation (e.g., WRITE at 1104), the method 1100 proceeds to 1130 of FIG. 14B, where a determination is made as to whether the desired operation is a row write or a column write. For a row write, the method 1100 proceeds to 1132, where the column lines are coupled with the sense amp inputs (e.g., column lines c00–c04 are coupled with the inputs to sense amps S/A00–S/A04 along lines Y00–Y04, respectively). The row lines (e.g., lines r00–r04) are coupled at 1134 with the decoder outputs (e.g., decoder outputs DO00–DO04). At 1136, a plateline signal is provided to the selected row line via a decoder output, and the memory cell data states are written at 1138 to the memory cells coupled with the selected row (e.g., cells $C_{00}$, $C_{01}$, $C_{02}$, $C_{03}$, and $C_{04}$ in FIG. 4A), before the row write operation ends at 1140.

If, however, the operation is a column write, the method 1100 proceeds from 1130 to 1150, where the row lines (e.g., row lines r00–r04) are coupled with the sense amp inputs (e.g., the inputs to sense amps S/A00–S/A04 along lines Y00–Y04). The column lines (e.g., lines c00–c04) are coupled at 1152 with the decoder outputs (e.g., DO00–DO04 in FIG. 4A). At 1154, a plateline signal is provided to the selected column line (e.g., c00) via a decoder output (e.g., DO00), and the memory cell data states are written at 1156 to the memory cells coupled with the selected row (e.g., cells $C_{00}$, $C_{10}$, $C_{20}$, $C_{30}$, and $C_{40}$ in FIG. 4A), before the column write operation ends at 1140.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A ferroelectric memory device, comprising:
   a memory array comprising a plurality of ferroelectric memory cells arranged in cell columns and cell rows, a plurality of column lines individually associated with one of a plurality of cell columns in the array, and a plurality of row lines individually associated with one of a plurality of cell rows in the array, the cells individually being coupled with a single row line and a single column line in the array;
   a plurality of row sense amps individually comprising a row sense amp input coupled with one of the plurality of row lines, the row sense amp inputs being individually adapted to sense a memory cell data state during a column read operation;
   a plurality of column sense amps individually comprising a column sense amp input coupled with one of the plurality of column lines, the column sense amp inputs being individually adapted to sense a memory cell data stale during a row read operation; and
   a decoder comprising:
      a plurality of row decoder outputs individually coupled with individual ones of the row lines, the decoder being adapted to provide a plateline signal to one of the row decoder outputs according to address information for a selected row during a row read operation; and
      a plurality of column decoder outputs individually coupled with individual ones of the column lines, the decoder being adapted to provide a plateline signal to one of the column decoder outputs according to address information for a selected column during a column read operation.

2. The memory device of claim 1, further comprising a reference generator coupled with the sense amps and providing a reference voltage during read operations, wherein the plurality of row sense amps individually comprise the row sense amp input and a complimentary row sense amp input coupled with the reference voltage from the reference generator during a row read operation, and wherein the plurality of column sense amps individually comprise the column sense amp input and a complimentary column sense amp input coupled with the reference voltage from the reference generator during a column read operation.

3. The memory device of claim 2, wherein the decoder is adapted to provide a plateline signal to one of the row decoder outputs according to address information for a selected row during a row write operation and to provide a plateline signal to one of the column decoder outputs according to address information for a selected column during a column read operation, wherein the row sense amps are individually adapted to provide write data to the row sense amp input during a column write operation, and wherein the column sense amps are individually adapted to provide write data to the column sense amp input during a row write operation.

4. The memory device of claim 1, wherein the decoder is adapted to provide a plateline signal to one of the row decoder outputs according to address information for a selected row during a row write operation and to provide a plateline signal to one of the column decoder outputs according to address information for a selected column during a column read operation, wherein the row sense amps are individually adapted to provide write data to the row sense amp input during a column write operation, and wherein the column sense amps are individually adapted to provide write data to the column sense amp input during a row write operation.

5. A ferroelectric memory device, comprising:
a memory array comprising a plurality of ferroelectric memory cells arranged in cell columns and cell rows, a plurality of column lines individually associated with one of a plurality of cell columns in the array, and a plurality of row lines individually associated with one of a plurality of cell rows in the array, the cells individually being coupled with a single row line and a single column line in the array;
a plurality of sense amps individually comprising a sense amp input adapted to sense or write a memory cell data state when a memory cell is coupled with the sense amp;
a decoder comprising a plurality of decoder outputs, the decoder adapted to provide a plateline signal to one of the decoder outputs according to address information for a selected row or column during a read or write operation; and
a selector system coupled with the row lines, the column lines, the sense amps, and the decoder outputs, and being adapted to selectively couple at least one of the row lines with one of the decoder outputs and the column lines with the sense amp inputs to read or write a row of memory cells or to couple at least one of the column lines with one of the decoder outputs and the row lines with the sense amp inputs to read or write a column of memory cells.

6. The memory device of claim 5, wherein the selector system comprises a plurality of switching circuits, the individual switching circuits being coupled with an individual one of the row lines, an individual one of the column lines, an individual one of the sense amp inputs, and an individual one of the decoder outputs, wherein the individual switching circuits are adapted to selectively couple the individual one of the row lines with the individual one of the decoder outputs and to couple the individual one of the column lines with the individual one of the sense amp inputs during a row read or a row write operation, and wherein the individual switching circuits are adapted to couple the individual one of the column lines with the individual one of the decoder outputs and to couple the individual one of the row lines with the individual one of the sense amp inputs during a column read or a column write operation.

7. The memory device of claim 6, wherein the switching circuits individually comprise:

a first switching device adapted to electrically connect the individual one of the column lines to the individual one of the decoder outputs during a column read or a column write operation:
a second switching device adapted to electrically connect the individual one of the row lines to the individual one of the sense amp inputs during a column read or a column write operation;
a third switching device adapted to electrically connect the individual one of the row lines to the individual one of the decoder outputs during a row read or a row write operation; and
a fourth switching device to electrically connect the individual one of the column lines lo the individual one of the sense amp inputs during a row read or a row write operation.

8. The memory device of claim 7, wherein the switching devices are MOS transistors.

9. The memory device of claim 6, further comprising a reference generator coupled with the sense amps and providing a reference voltage during read operations, wherein the plurality of row sense amps individually comprise the row sense amp input and a complimentary row sense amp input coupled with the reference voltage from the reference generator during a row read operation, and wherein the plurality of column sense amps individually comprise the column sense amp input and a complimentary column sense amp input coupled with the reference voltage from the reference generator during a column read operation.

10. A ferroelectric memory device, comprising:
a memory array comprising a plurality of ferroelectric memory cells arranged in cell columns and cell rows, a plurality of column lines individually associated with one of a plurality of cell columns in the array, and a plurality of row lines individually associated with one of a plurality of cell rows in the array, the cells individually being coupled with a single row line and a single column line in the array; and
means for selectively accessing a group of memory cells along one of a column line and a row line in a single memory operation.

11. The device of claim 10, wherein the means for selectively accessing a group of memory cells comprises:
a plurality of row sense amps individually comprising a row sense amp input coupled with one of the plurality of row lines, the row sense amp inputs being individually adapted to sense a memory cell data state during a column read operation and to provide write data to the row line during a column write operation;
a plurality of column sense amps individually comprising a column sense amp input coupled with one of the plurality of column lines, the column sense amp inputs being individually adapted to sense a memory cell data state during a row read operation and to provide write data to the column line during a row write operation; and
a decoder comprising:
a plurality of row decoder outputs individually coupled with individual ones of the row lines, the decoder being adapted to provide a plateline signal to one of the row decoder outputs according to address information for a selected row during a row read or write operation; and
a plurality of column decoder outputs individually coupled with individual ones of the column lines, the decoder being adapted to provide a plateline signal to one of the column decoder outputs according to address information for a selected column during a column read or write operation.

12. A ferroelectric memory device, comprising:
a memory array comprising a plurality of ferroelectric memory cells arranged in cell columns and cell rows, a plurality of column lines individually associated with one of a plurality of cell columns in the array, and a plurality of row lines individually associated with one of a plurality of cell rows in the array, the cells individually being coupled with a single row line and a single column line in the array; and
means for selectively accessing a group of memory cells along one of a column line and a row line in a single memory operation, wherein the means for selectively accessing a group of memory cells comprises:
 a plurality of sense amps individually comprising a sense amp input adapted to sense or write a memory cell data state when a memory cell is coupled with the sense amp;
 a decoder comprising a plurality of decoder outputs, the decoder adapted to provide a plateline signal to one of the decoder outputs according to address information for a selected row or column during a read or write operation; and
 a selector system coupled with the row lines, the column lines, the sense amps, and the decoder outputs, and being adapted to selectively couple at least one of the row lines with one of the decoder outputs and the column lines with the sense amp inputs to read or write a row of memory cells or to couple at least one of the column lines with one of the decoder outputs and the row lines with the sense amp inputs to read or write a column of memory cells.

13. The memory device of claim 12, wherein the selector system comprises a plurality of switching circuits, the individual switching circuits being coupled with an individual one of the row lines, an individual one of the column lines, an individual one of the sense amp inputs, and an individual one of the decoder outputs, wherein the individual switching circuits are adapted to selectively couple the individual one of the row lines with the individual one of the decoder outputs and to couple the individual one of the column lines with the individual one of the sense amp inputs during a row read or a row write operation, and wherein the individual switching circuits are adapted to couple the individual one of the column lines with the individual one of the decoder outputs and to couple the individual one of the row lines with the individual one of the sense amp inputs during a column read or a column write operation.

14. The memory device of claim 13, wherein the switching circuits individually comprise:
 a first switching device adapted to electrically connect the individual one of the column lines to the individual one of the decoder outputs during a column read or a column write operation;
 a second switching device adapted to electrically connect the individual one of the row lines to the individual one of the sense amp inputs during a column read or a column write operation;
 a third switching device adapted to electrically connect the individual one of the row lines to the individual one of the decoder outputs during a row read or a row write operation; and
 a fourth switching device to electrically connect the individual one of the column lines to the individual one of the sense amp inputs during a row read or a row write operation.

15. The memory device of claim 14, wherein the switching devices are MOS transistors.

16. A method of reading a row or a column of ferroelectric memory cells in a memory array, the array comprising a plurality of row lines and a plurality of column lines, the cells being individually coupled with a single row line and a single column line in the memory array, the method comprising:
 individually coupling the plurality of column lines to a plurality of sense amps during a row read operation;
 providing a plateline signal to one of the plurality of row lines during the row read operation;
 sensing memory cell data states associated with a row of memory cells coupled with the one of the plurality of row lines using the plurality of sense amps during the row read operation;
 individually coupling the plurality of row lines to the plurality of sense amps during a column read operation;
 providing a plateline signal to one of the plurality of column lines during the column read operation; and
 sensing memory cell data slates associated with a column of memory cells coupled with the one of the plurality of column lines using the plurality of sense amps during the column read operation.

17. The method of claim 16, wherein providing the plateline signal to one of the plurality of row lines during the row read operation comprises:
 individually coupling the plurality of row lines with a plurality of decoder outputs during the row read operation; and
 providing the plateline signal to one of the decoder outputs according to address information for a selected row during the row read operation.

18. The method of claim 16, wherein providing the plateline signal to one of the plurality of column lines during the column read operation comprises:
 individually coupling the plurality of column lines with a plurality of decoder outputs during the column read operation; and
 providing the plateline signal to one of the decoder outputs according to address information for a selected column during the column read operation.

19. A method of writing a row or a column of ferroelectric memory cells in a memory array, the array comprising a plurality of row lines and a plurality of column lines, the cells being individually coupled with a single row line and a single column line in the memory array, the method comprising:
 individually coupling the plurality of column lines to a plurality of sense amps during a row write operation;
 providing a plateline signal to one of the plurality of row lines during the row write operation;
 writing memory cell data states to a row of memory cells coupled with the one of the plurality of row lines using the plurality of sense amps during the row write operation;
 individually coupling the plurality of row lines to the plurality of sense amps during a column write operation;
 providing a plateline signal to one of the plurality of column lines during the column write operation; and
 writing memory cell data states to a column of memory cells coupled with the one of the plurality of column lines using the plurality of sense amps during the column write operation.

20. The method of claim 19, wherein providing the plateline signal to one of the plurality of row lines during the row write operation comprises:

individually coupling the plurality of row lines with a plurality of decoder outputs during the row write operation; and providing the plateline signal to one of the decoder outputs according to address information for a selected row during the row write operation.

21. The method of claim 19, wherein providing the plateline signal to one of the plurality of column lines during the column write operation comprises:

individually coupling the plurality of column lines with a plurality of decoder outputs during the column write operation; and providing the plateline signal to one of the decoder outputs according to address information for a selected column during the column write operation.

* * * * *